(12) United States Patent
Kunikiyo

(10) Patent No.: US 6,495,424 B2
(45) Date of Patent: Dec. 17, 2002

(54) SEMICONDUCTOR DEVICE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/978,659

(22) Filed: Oct. 18, 2001

(65) Prior Publication Data

US 2002/0022326 A1 Feb. 21, 2002

Related U.S. Application Data

(63) Continuation of application No. 09/549,378, filed on Apr. 13, 2001, now Pat. No. 6,333,232.

(30) Foreign Application Priority Data

Nov. 11, 1999 (JP) ............................................. 11-321329

(51) Int. Cl.[7] .............................................. H01L 21/336
(52) U.S. Cl. ....................................... 438/296; 438/242
(58) Field of Search ................................. 438/424, 420, 438/421, 435, 437, 438, 439, 296, 221

(56) References Cited

U.S. PATENT DOCUMENTS

| 5,616,401 | A | | 4/1997 | Kobayashi et al. | |
|---|---|---|---|---|---|
| 5,719,085 | A | * | 2/1998 | Moon et al. | 438/424 |
| 5,780,346 | A | | 7/1998 | Arghavani et al. | |
| 5,854,509 | A | | 12/1998 | Kunikiyo | |
| 5,904,538 | A | | 5/1999 | Son et al. | |
| 5,989,978 | A | * | 11/1999 | Peidous | 438/436 |
| 6,251,746 | B1 | * | 6/2001 | Hong et al. | 438/424 |
| 6,291,300 | B1 | * | 9/2001 | Fukazawa et al. | 438/296 |
| 6,339,004 | B1 | * | 1/2002 | Kim | 438/296 |

FOREIGN PATENT DOCUMENTS

| JP | 8-213382 | 8/1996 |
|---|---|---|
| JP | 9-82794 | 3/1997 |
| JP | 10-270546 | 10/1998 |
| KR | 1998-074323 | 11/1998 |

* cited by examiner

Primary Examiner—David Nelms
Assistant Examiner—Dung Anh Le
(74) Attorney, Agent, or Firm—Oblon, Spivak, McClelland, Maier & Neustadt, P.C.

(57) ABSTRACT

Before forming a trench in a silicon substrate through a patterned silicon nitride film serving as a mask, etching is executed until the main surface of the silicon substrate is exposed. Thereafter exposed side walls of a silicon dioxide film and a polysilicon film and the exposed surface of the silicon substrate are oxynitrided thereby forming an silicon oxynitride film. Thereafter the trench is formed, then a silicon dioxide film is formed on its inner wall, and thereafter the trench is filled with an insulation. In the process of forming the silicon dioxide film on the inner wall, a bird's beak is formed on the side walls of the silicon dioxide film and the polysilicon film. The silicon oxynitride film suppresses excessive growth of the bird's beak and prevents the bird's beak from formation of a depressed part. Thus, reduction of the area of an active region caused by the bird's beak is suppressed without no depression part formed on the upper end of an STI structure.

4 Claims, 34 Drawing Sheets

SEMICONDUCTOR DEVICE

CROSS REFERENCE TO RELATED PATENT

The subject matter of the present application is a continuation of Ser. No. 09/549,378, filed on Apr. 13, 2000 now U.S. Pat. No. 6,333,232.

BACKGROUND OF THE INVENTION

1. Field of the Invention

The present invention relates to a semiconductor device having an element isolation structure in the main surface of a semiconductor substrate and a method of manufacturing the same, and more particularly, it relates to a semiconductor device whose element isolation structure is an STI structure having a bird's beak on its upper end and a method of manufacturing the same.

2. Description of the Background Art

In a semiconductor device structured as an integrated circuit, a number of semiconductor elements are formed in active regions of a semiconductor substrate. An element isolation structure electrically isolates these semiconductor elements from each other, for preventing unnecessary interference thereamong. At the same time, in order to implement prescribed functions for which the integrated circuit is designed, an electrical conductor (wire) formed on the element isolation structure selectively connects these semiconductor elements with each other.

When element isolation is incomplete, a leakage current flows between the semiconductor elements. When still another semiconductor element recognizes the leakage current as a signal, it follows that the integrated circuit malfunctions. Therefore, element isolation must be completely performed in order to keep operations of the integrated circuit normal, and hence it can be said that element isolation is an important technique.

In a semiconductor device of such a generation that the minimum line width on a silicon substrate is set to not more than 0.2 $\mu$m, its element isolation structure changes from a conventional LOCOS (local oxidation of silicon) structure to an STI (shallow trench isolation) structure. The conventional element isolation structure formed by a LOCOS method has such disadvantages that (1) a large bird's beak remarkably corrodes and narrows active regions, (2) a channel stop impurity layer formed in a substrate region located under the LOCOS structure is re-distributed in a later heat treatment step, (3) the thickness of a LOCOS oxide film changes between a narrow pitch (width of the element isolation structure or the active regions) and a wide pitch, and (4) a lithography process becomes difficult due to large steps between the active regions and the element isolation structure.

Element isolation by the STI structure has been proposed as a method of solving these problems. Steps of forming the same are briefly described. First, a trench of about 0.1 to 0.5 $\mu$m in depth is formed on the main surface of a silicon substrate by anisotropic etching, and thereafter filled with an insulator. This insulator is flattened by CMP (chemical mechanical polishing) or the like, thereby completing an STI element isolation structure. Since such flattening is performed, the step between the main surface of the semiconductor substrate and the surface of the element isolation structure is smaller as compared with that in an element isolation structure formed by the LOCOS method.

The STI element isolation structure is formed in an initial stage among a series of steps for forming an integrated circuit. In other words, the STI element isolation structure is formed in a step before source and drain regions of a MOS (metal oxide semiconductor) transistor are formed by ion implantation in the vicinity of surfaces of active regions holding the element isolation structure. The STI element isolation structure suppresses such a disadvantage that a channel of a parasitic MOSFET (MOS field-effect transistor) is formed in a field region (region of the element isolation structure: element isolation region) between the active regions. Consequently, an integrated circuit having a small leakage current between active regions holding an element isolation structure is implemented regardless of presence/absence of operations of a MOSFET.

The STI structure is an element isolation structure essentially free from a bird's beak, i.e., involving no bird's beak. In the STI structure free from a bird's beak, however, stress resulting from the shape of a trench forming the STI structure concentrates to a corner part (part between the bottom and the side wall) on the bottom of the trench or the upper end (i.e., opening end) of the trench, to result in formation of a defect in a silicon substrate. When a defect is formed around the trench, a leakage current is increased when the MOSFET is turned off, to remarkably increase power consumption of the semiconductor device.

It is known as a conventional technique that the inner wall of the trench is oxidized thereby the shape of the corner part on the bottom of the trench is rounded while simultaneously a small bird's beak is formed on the upper end of the trench thereby the shape of the trench is rounded so that the stress is relaxed. In this technique, however, it follows that a small bird's beak is formed from the element isolation structure toward the active regions despite the STI structure.

A series of steps of forming an STI structure including a step of forming a bird's beak are now described in detail. FIGS. 48 to 58 are step diagrams showing a conventional method of forming an STI structure. In order to form the STI structure, a silicon dioxide film 102, a polysilicon film 103 and a silicon nitride film 104 are formed in this order on a silicon substrate 101, as shown in FIG. 48. The silicon dioxide film 102 is also referred to as an underlayer oxide film.

The step shown in FIG. 49 is then carried out. In the step shown in FIG. 49, resist is applied onto the silicon nitride film 104 and thereafter patterned through a transfer step, for forming a resist mask 105. Thereafter the resist mask 105 is employed as a mask (screen) for executing anisotropic etching, thereby selectively removing the silicon nitride film 104. Since the ratio of the etching rates for the silicon nitride film 104 and the polysilicon film 103 is sufficiently large, the anisotropic etching stops on the upper surface of the polysilicon film 103. In this step, the resist mask 105 is also partially removed by the etching. If the quantity of this overetching is large, the resist mask 105 may be entirely removed.

In the subsequent step shown in FIG. 50, the resist mask 105 is removed and thereafter anisotropic etching is executed through the patterned silicon nitride film 104 employed as a hard mask, thereby selectively removing the polysilicon film 103, the silicon dioxide film 102 and the silicon substrate 101 in this order. Needless to say, etchants employed for the anisotropic etching are properly changed following stepwise change of the films to be removed in this step. Through this step, a trench 106 of about 300 nm in depth, for example, is formed in the silicon substrate 101. In the anisotropic etching performed on the silicon substrate 101, the etching rate for polysilicon is larger than that for single-crystalline silicon. Therefore, the inner wall of the polysilicon film 103 slightly retreats through the step shown in FIG. 50.

Then, as shown in FIG. 51, an inner wall silicon dioxide film 107 of about 50 nm in thickness is formed on the inner wall of the trench 106 by thermal oxidation. This treatment is referred to as inner wall oxidation. The inner wall oxidation is performed in order to round the shape of a corner part on the bottom of the trench 106 or that of the upper end of the trench 106 for attaining an effect of relaxing stress, as described above. In addition to this effect, an effect of introducing an etching damage layer formed on the surface part of the inner wall of the trench 106 by the anisotropic etching into the inner wall silicon dioxide film 107 for reducing defects (point defects, dislocations etc.) in the silicon substrate 101 and an effect of reducing interface state density between the STI structure and the silicon substrate 101 are also attained by performing the inner wall oxidation.

In the step shown in FIG. 51, the inner wall of the polysilicon film 103 and part of the silicon substrate 101 coming into contact with the silicon dioxide film 102 are simultaneously oxidized to form a bird's beak 108 on the upper end of the trench 106. A thermal oxide film of polysilicon grows at a higher rate than that of single-crystalline silicon, and hence the thickness of a silicon dioxide film formed on the polysilicon film 103 is larger than that of a silicon dioxide film formed on the silicon substrate 101. Consequently, the bird's beak length (the thickness of the bird's beak 108 along the main surface of the silicon substrate 101) is larger than the thickness of the remaining part of the inner wall silicon dioxide film 107. Needless to say, active regions are reduced as the thickness of the inner wall silicon dioxide film 107 is increased. When the active regions are reduced, the gate width of a MOS transistor is reduced, for example, and hence a drain current disadvantageously falls below a designed value.

It is possible to assume a method of omitting the step of depositing the polysilicon film 103 and directly depositing the silicon nitride film 104 on the silicon dioxide film 102 in order to reduce the bird's beak length. In this case, however, stress caused on the upper end of the trench 108 is disadvantageously increased as compared with the case of providing the polysilicon film 103, depending on the conditions.

Then, the trench 106 covered with the inner wall silicon dioxide film 107 is filled with silicon dioxide 109, for example, as shown in FIG. 52. This step is carried out by depositing the silicon dioxide 109 to cover the upper surface of the silicon nitride film 104, the side surfaces of the silicon nitride film 104 and the polysilicon film 103, the side surface of the underlayer dioxide film 102 and the inner wall of the silicon substrate 101 by a film formation method such as HDP (high density plasma)-CVD (chemical vapor deposition), for example, simultaneously performing etching and film formation. The trench 107 may be basically filled with any insulation such as silicon dioxide, silicon oxynitride or TEOS, for example.

Then, CMP (chemical mechanical polishing) is performed through the silicon nitride film 104 serving as a stopper thereby flattening the upper end of the silicon dioxide 109, as shown in FIG. 53. After this flattening step, the silicon dioxide 109 remains in the trench 106.

Then, the silicon nitride film 104 and the polysilicon film 103 are removed by etching, as shown in FIG. 54.

Then, as FIG. 55 shows, the upper portion of the silicon dioxide 109 is removed by etching, for leaving silicon dioxide 120 as a principal component of the STI structure.

At this time, part of the bird's beak 108 and the silicon dioxide film 102 are simultaneously removed by etching. If the inner wall silicon dioxide film 107 is thick and hence the bird's beak 108 is also thick, the upper end of the STI structure is not depressed toward the silicon substrate 101, as shown by symbol F in FIG. 55. If the bird's beak 108 is thin or the etching is overetching, however, a depressed part 110 is caused as shown by symbol G in FIG. 56.

Then, the following step is carried out for forming a structure shown in FIG. 57 or 58 for the structure of FIG. 55 or FIG. 56. In this step, an underlayer oxide film is first formed in a thickness of 10 nm to 20 nm to cover the main surface of the silicon substrate 101 and heat-treated at a temperature of 800° C. to 1100° C. This treatment, performed for densifying the silicon dioxide 120 filled into the trench 106, is referred to as thermal shrinking. After the thermal shrinking step, well implantation (ion implantation for forming a well in the silicon substrate 101), channel stopper implantation (ion implantation for forming a channel stopper in the silicon substrate 101) and channel implantation (ion implantation for forming a channel in the silicon substrate 101) are performed and thereafter the aforementioned underlayer oxide film is removed by etching. Then, the main surface of the silicon substrate 101 is thermally oxidized thereby forming a gate insulator film 111, and then a gate electrode 112 is deposited. Consequently, the structure shown in FIG. 57 or 58 is completed.

When the depressed part 110 is formed as shown in FIG. 58, the gate electrode 112 is formed to partially fill up the depressed part 110. Therefore, even if the thickness of the gate insulator film 111 and a voltage applied to the gate electrode 112 are uniform between a plurality of semiconductor elements, electric field strength on the upper end of the STI structure is greater in the region G shown in FIG. 58 having the depressed part 110 as compared with the region F shown in FIG. 57 having no depressed part 110. This results from the difference in the thickness (bird's beak length) of the bird's beak 108. In the structure shown in FIG. 58 having the depressed part 110, therefore, a potential is bent larger in the vicinity of the upper end of the STI structure in the silicon substrate 101, to reduce the threshold voltage in this region. In the vicinity of the center of the active region separate from the upper end of the STI structure, on the other hand, the threshold voltage remains substantially identical between the structures shown in FIGS. 57 and 58 due to the same structure.

The ratio of an end of the STI structure to the gate width (width of the active regions) is increased when the gate width is reduced, and hence, as shown in a graph of FIG. 59, the threshold voltage is reduced in the structure shown in FIG. 58 having the depressed part 110 (curve C11). While the threshold voltage is reduced when the gate width is reduced also in the structure shown in FIG. 57 having no depressed part 110 (curve C10), the degree of this reduction is small.

The threshold voltage is reduced also in the structure shown in FIG. 57 since the amount of a channel dopant introduced into the silicon substrate 101 is reduced as compared with the center of the active region when channel implantation is performed through the thick bird's beak 108 with low energy. Although the threshold voltage must be increased when the bird's beak 108 is thick since an effective gate insulator film thickness on the upper end of the STI structure is increased as compared with the centers of the active region, an effect of reducing the amount (dose) of ions introduced into the silicon substrate 101 is large if the energy for channel implantation is low and hence the threshold voltage tends to slightly lower as the gate width is reduced as a whole. If the channel implantation is performed with high energy and therefore the ions are implanted into the silicon substrate 101 by about 100% through the thick bird's beak 108 in the channel implantation, the threshold voltage tends to increase as the gate width is reduced. The effect of thus increasing the threshold voltage as the gate width is reduced is referred to as "narrow channel effect" and an effect of reducing the threshold voltage as the gate width is reduced is referred to as "inverse narrow channel effect".

Therefore, it is disadvantageous that the inverse narrow channel effect becomes remarkable when the depressed part 110 is present on the upper end of the STI structure, as shown in FIG. 59. This is because the threshold voltage is remarkably dispersed as the inverse narrow channel effect becomes remarkable when the finished gate width fluctuates, to cause a malfunction of the semiconductor device or reduction of the yield.

FIG. 60 is a graph showing a gate voltage-to-drain current characteristic of a MOSFET employing the aforementioned STI structure for element isolation. As shown on a curve C13, a hump HP appears when the depressed part 110 is present on the upper end of the STI structure. This is because the potential is bent more largely on the gate end as compared with the center of the active region to reduce the threshold voltage on the gate end due to concentration of an electric field in the vicinity of the depressed part 110 in the silicon substrate 101 and hence a drain current flows as a leakage current at a gate voltage lower than the threshold voltage at the center of the active region. This characteristic is also a sign of the inverse narrow channel effect. Thus, the drain current flows in a standby state of the MOSFET when the inverse narrow channel effect results from the depressed part 110, to disadvantageously increase power consumption of the semiconductor device.

While it is effective to increase the thickness of the bird's beak 108 in order to prevent formation of the depressed part 110 on the end of the STI structure, the area of the active region is disadvantageously reduced in this case. When the width of the active regions is reduced, the effective gate width is also reduced to disadvantageously reduce the drain current of the MOSFET.

The trench 106 is formed by anisotropically etching the silicon substrate 101, and hence dangling bonds (unsaturated bonds of silicon atoms) or irregular grain structures are formed in the vicinity of the side wall and the bottom surface of the trench 106 in the silicon substrate 101. After formation of the STI structure, source/drain regions (a set of source and drain regions formed in one MOSFET are generically referred to as "source/drain regions") are formed on the active regions of the silicon substrate 101 by ion implantation, and thereafter high-temperature heat treatment is performed. Thus, ions implanted into the active regions are electrically activated and crystal defects present in the silicon substrate 101 disappear to recover the crystallographic order of the silicon substrate 101. In this high-temperature heat treatment, an impurity such as boron having a relatively high impurity diffusion coefficient diffuses to reach the STI structure. When irregular grain structures are present, the impurity acceleratingly diffuses along the grain boundaries thereof to reach the STI structure. Further, the dangling bonds provide proper bond sites for the diffusing impurity species, and hence it follows that the impurity is accumulated on the interface of the STI structure or in the vicinity thereof.

It is known that, when impurity species are present in an STI structure, defects follow in relatively high density. In relation to this, the following phenomena are observed: (1) Dislocations are formed in the vicinity of the STI structure in the silicon substrate 101 due to clusters of the impurity species. (2) A voltage necessary for dielectric breakdown of the STI structure is reduced as the defect density (or the dopant concentration) in the STI structure is increased. Consequently, dielectric breakdown takes place on a portion of the STI structure having high defect density (dopant concentration) when a voltage is applied to the source/drain regions formed adjacently to the STI structure. Further, a leakage current resulting from defects flows in or around the STI structure, and hence the threshold voltage is reduced in the vicinity of the side wall of the STI structure.

The chip area of the semiconductor device must be reduced in order to save the cost for manufacturing the same, and hence the isolation width of the STI structure tends to reduce. Therefore, the parasitic capacitance between active regions must be reduced in order to guarantee element isolability among semiconductor elements formed on the active regions. This parasitic capacitance depends on the element isolation width and the relative dielectric constant of the insulator filled into the STI structure. More specifically, the parasitic capacitance between two active regions isolated by the STI structure is proportional to the dielectric constant of the insulator filled into the STI structure and substantially inverse proportional to the element isolation width. The relative dielectric constant is that of a substance normalized with a vacuum dielectric constant. $SiO_2$ is known as a representative insulator filled into the STI structure. The relative dielectric constant of $SiO_2$, which is about 3.7 to 3.9 is by no means small. When the element isolation width is reduced, therefore, the parasitic capacitance is problematically increased. Following this, an isolation breakdown voltage is also reduced. Further, a leakage current flows between source/drain regions of one MOSFET and those of another MOSFET, to result in a malfunction of the integrated circuit.

SUMMARY OF THE INVENTION

A semiconductor device according to a first aspect of the present invention has an element isolation structure separating a main surface of a semiconductor substrate into a plurality of regions selectively formed on the main surface and a semiconductor element formed on each of the plurality of regions, and the element isolation structure comprises an inner wall insulator film formed on an inner wall of a trench selectively formed in the main surface to include an oxide semiconductor film coming into contact with the inner wall and having a bird's beak, increased in thickness on an opening end of the trench, containing an oxynitride semiconductor, and an insulation filled into the trench through the inner wall insulator film.

In the device according to the first aspect, the bird's beak contains the oxynitride semiconductor, whereby excessive growth of the bird's beak following formation of the inner wall insulator film is suppressed in a manufacturing step for suppressing reduction of an active region. At the same time, the part of the oxynitride semiconductor in the bird's beak is left unremoved, whereby no depressed part is formed despite the small thickness of the bird's beak.

According to a second aspect of the present invention, the inner wall insulator film contains an oxynitride semiconductor over a range from the bird's beak to a portion, shallower than the trench, under the bird's beak in the semiconductor device according to the first aspect.

In the device according to the second aspect, the inner wall insulator film contains the oxynitride semiconductor up to the portion under the bird's beak, whereby segregation of impurities contained in an active region of the semiconductor element is suppressed in a manufacturing step.

According to a third aspect of the present invention, another insulator film including a nitride semiconductor film is interposed between the insulator film and the insulation in the semiconductor device according to the first or second aspect.

In the device according to the third aspect, the nitride semiconductor film is interposed between the insulator film and the insulation, whereby diffusion of an oxidant following thermal oxidation is suppressed in a manufacturing step to suppress oxidation on the interface between the semiconductor substrate and the element isolation structure. Therefore, the density of oxidation-induced defects is suppressed.

According to a fourth aspect of the present invention, another insulator film including an oxynitride semiconductor film is interposed between the insulator film and the insulation in the semiconductor device according to the first or second aspect.

In the device according to the fourth aspect, the oxynitride semiconductor film is interposed between the insulator film and the insulation, whereby diffusion of an oxidant following thermal oxidation is suppressed in a manufacturing step to suppress oxidation on the interface between the semiconductor substrate and the element isolation structure. Therefore, the density of oxidation-induced defects is suppressed. Further, the coefficient of volumetric expansion of the oxynitride semiconductor is approximate to that of the semiconductor, whereby stress is further effectively relaxed.

A semiconductor device according to a fifth aspect of the present invention has an element isolation structure separating a main surface of a semiconductor substrate into a plurality of regions selectively formed on the main surface and a semiconductor element formed on each of the plurality of regions, and the element isolation structure comprises an inner wall insulator film formed on an inner wall of a trench selectively formed in the main surface to include an oxide semiconductor film coming into contact with the inner wall and a nitride semiconductor film covering the same and having a bird's beak increased in thickness on an opening end of the trench and a fluorine-containing insulation filled into the trench through the inner wall insulator film.

In the device according to the fifth aspect, the trench is filled with the fluorine-containing insulation, whereby the parasitic capacitance between the semiconductor elements isolated by the element isolation structure is reduced. Further, the nitride semiconductor film suppresses diffusion of an oxidant, thereby suppressing oxidation on the interface between the semiconductor substrate and the element isolation structure in thermal oxidation performed in a manufacturing step. Therefore, the density of oxidation-induced defects is suppressed.

A method of manufacturing a semiconductor device according to a sixth aspect of the present invention comprises steps of (a) preparing a semiconductor substrate having a main surface, (b) forming a multilayer film including an oxide semiconductor film and a nitride semiconductor film located thereon on the main surface of the semiconductor substrate, (c) patterning the nitride semiconductor film thereby selectively forming an opening having a shape separating the main surface into a plurality of regions in the nitride semiconductor film, (d) executing etching through the patterned nitride semiconductor film employed as a mask thereby selectively removing a portion immediately under the opening at least until the main surface of the semiconductor substrate is exposed, (e) oxynitriding a surface located under the nitride semiconductor film and exposed in a cavity formed immediately under the opening, (f) executing etching through the patterned nitride semiconductor film employed as a mask thereby forming a trench in a portion of the semiconductor substrate immediately under the opening, (g) forming an inner wall insulator film including an oxide semiconductor film coming into contact with an inner wall of the trench on the inner wall, (h) filling the trench with an insulation after the step (g), (i) removing the multilayer film at least after the step (g), and (j) forming a component of a semiconductor element in each of the plurality of regions separated from each other by the trench in the main surface of the semiconductor substrate.

In the manufacturing method according to the sixth aspect, an oxynitride semiconductor film is formed on the side wall of a portion under the nitride semiconductor film of the multilayer film through the oxynitriding step, thereby suppressing diffusion of an oxidant on the side wall of the portion under the nitride semiconductor film of the multilayer film in the step of forming the inner wall insulator film. Thus, excessive growth of a bird's beak following formation of the inner wall insulator film can be suppressed, for suppressing reduction of an active region. At the same time, an oxynitride semiconductor part in the bird's beak is left unremoved in the step of removing the multilayer film, whereby no depressed part is formed despite the small thickness of the bird's beak.

According to a seventh aspect of the present invention, the multilayer film further includes a polycrystalline semiconductor film held between the oxide semiconductor film and the nitride semiconductor film in the method of manufacturing a semiconductor device according to the sixth aspect.

In the manufacturing method according to the seventh aspect, a bird's beak largely grows due to the polycrystalline semiconductor film included in the multilayer film, whereby stress is further effectively relaxed.

According to an eighth aspect of the present invention, the step (d) further includes a step (d-1) of executing etching through the patterned nitride semiconductor film employed as a mask thereby selectively removing a portion immediately under the opening until a groove shallower than the trench is formed in the semiconductor substrate in the method of manufacturing a semiconductor device according to the sixth or seventh aspect.

In the manufacturing method according to the eighth aspect, an oxynitride film is formed also on the side wall of the groove formed in the semiconductor substrate, thereby suppressing segregation of impurities contained in an active region of the semiconductor element.

According to a ninth aspect of the present invention, the step (e) includes steps of (e-1) oxidizing the surface exposed in the cavity in an oxygen atmosphere and (e-2) oxynitriding the surface exposed in the cavity in a nitric oxide atmosphere after the step (e-1), and the step (j) includes a step (j-1) of forming a component of an N-channel MOSFET as the component of the semiconductor element in each of the plurality of regions in the method of manufacturing a semiconductor device according to any of the sixth to eighth aspects.

In the manufacturing method according to the ninth aspect, the oxynitriding step is carried out by performing oxidation in the oxygen atmosphere and thereafter performing oxynitridation in the nitric oxide atmosphere, thereby increasing the nitrogen concentration in the semiconductor substrate. Thus, the mobility of an inversion layer of the N-channel MOSFET is increased.

According to a tenth aspect of the present invention, the step (e) comprises steps of (e-1) oxynitriding the surface exposed in the cavity in a nitric oxide atmosphere and (e-2) oxidizing the surface exposed in the cavity in an oxygen atmosphere after the step (e-1), and the step (j) comprises a step (j-1) of forming a component of a P-channel MOSFET as the component of the semiconductor element in each of the plurality of regions in the method of manufacturing a semiconductor device according to any of the sixth to eighth aspects.

In the manufacturing method according to the tenth aspect, the oxynitriding step is carried out by performing oxynitridation in the nitric acid atmosphere and thereafter performing oxidation in the oxygen atmosphere, thereby reducing the nitrogen concentration in the semiconductor substrate. Thus, reduction of mobility of an inversion layer of the P-channel MOSFET is suppressed.

A method of manufacturing a semiconductor device according to an eleventh aspect of the present invention comprises steps of (a) preparing a semiconductor substrate having a main surface, (b) forming a multilayer film including an oxide semiconductor film, an oxynitride semiconductor film or an oxyhalide semiconductor film coming into contact therewith and a nitride semiconductor film located thereon on the main surface of the semiconductor substrate, (c) patterning the nitride semiconductor film thereby selectively forming an opening having a shape separating the main surface into a plurality of regions in the nitride semiconductor film, (d) executing etching through the patterned nitride semiconductor film employed as a mask for selectively removing a portion immediately under the opening thereby forming a trench in a portion of the semiconductor substrate immediately under the opening, (e) forming an inner wall insulator film including an oxide semiconductor film coming into contact with an inner wall of the trench on the inner wall, (f) filling the trench with an insulation after the step (e), (g) removing the multilayer film at least after the step (e), and (h) forming a component of a semiconductor element in each of the plurality of regions separated from each other by the trench in the main surface of the semiconductor substrate.

In the manufacturing method according to the eleventh aspect, the multilayer film includes the oxynitride semiconductor film or the oxyhalide semiconductor film coming into contact with the oxide semiconductor film, whereby diffusion of an oxidant is suppressed on the side wall of a portion under the nitride semiconductor film of the multilayer film in the step of forming the inner wall insulator film. Thus, it is possible to suppress excessive growth of a bird's beak following formation of the inner wall insulator film, for suppressing reduction of an active region. Further, an oxynitride semiconductor part in the bird's beak is left unremoved in the step of removing the multilayer film, whereby no depressed part is formed despite the small thickness of the bird's beak.

According to a twelfth aspect of the present invention, the step (g) includes a step (g-1) of removing the nitride semiconductor film included in the multilayer film between the steps (e) and (f), and the method further comprises a step (i) of forming an insulator film including a nitride semiconductor film on an exposed surface between the steps (g-1) and (f) in the method of manufacturing a semiconductor device according to the eleventh aspect.

In the manufacturing method according to the twelfth aspect, the nitride semiconductor film has a function of suppressing diffusion of an oxidant, thereby suppressing oxidation on the interface between the semiconductor substrate and the element isolation structure in thermal oxidation performed in the step of forming the element of the semiconductor element or the like. Thus, occurrence of oxidation-inductive defects is suppressed.

According to a thirteenth aspect of the present invention, the insulator film further includes a nitride semiconductor film in the method of manufacturing a semiconductor device according to the twelfth aspect.

According to a fourteenth aspect of the present invention, the step (g) includes a step (g-1) of removing the nitride semiconductor film included in the multilayer film between the steps (e) and (f), and the method further comprising a step (i) of forming an insulator film including an oxynitride semiconductor film on an exposed surface between the steps (g-1) and (f) in the method of manufacturing a semiconductor device according to the eleventh aspect.

In the manufacturing method according to the fourteenth aspect, the oxynitride semiconductor film has a function of suppressing diffusion of an oxidant, thereby suppressing oxidation on the interface between the semiconductor substrate and the element isolation structure in thermal oxidation performed in the step of forming the element of the semiconductor element or the like. Thus, occurrence of oxidation-inductive defects is suppressed. Further, the coefficient of volume expansion of the oxynitride semiconductor is approximate to that of the semiconductor, whereby stress is further effective relaxed.

A method of manufacturing a semiconductor device according to a fifteenth aspect of the present invention comprises steps of (a) preparing a semiconductor substrate having a main surface, (b) forming a multilayer film including an oxide semiconductor film and a nitride semiconductor film located thereon on the main surface of the semiconductor substrate, (c) patterning the nitride semiconductor film thereby selectively forming an opening having a shape separating the main surface into a plurality of regions in the nitride semiconductor film, (d) executing etching through the patterned nitride semiconductor film employed as a mask for selectively removing a portion immediately under the opening thereby forming a trench in a portion of the semiconductor substrate immediately under the opening, (e) forming an inner wall insulator film including an oxide semiconductor film coming into contact with an inner wall of the trench on the inner wall, (f) filling the trench with an insulation after the step (e), (g) removing the multilayer film at least after the step (e), (h) forming a component of a semiconductor element in each of the plurality of regions separated from each other by the trench in the main surface of the semiconductor substrate, and (i) implanting nitrogen, halogen or nitrogen halide into at least part of the multilayer film at least after the step (a).

In the manufacturing method according to the fifteenth aspect, nitrogen, halogen or nitrogen halide is implanted into at least part of the multilayer film, so that the implanted element thermally diffuses due to heat treatment performed in some later step, to reach a portion close to a bird's beak on the upper end of the element isolation structure or the interface between the oxide semiconductor film and the semiconductor substrate. Consequently, the interface state density is reduced in this region, to reduce dispersion of the characteristics of the semiconductor element.

According to a sixteenth aspect of the present invention, the step (d) comprises steps of (d-1) executing the etching until the oxide semiconductor film included in the multilayer film is exposed and (d-2) executing the etching until the trench is formed after the step (d-1), and the step (i) includes a step (i-1) of oblique-rotationally implanting nitrogen, halogen or nitrogen halide into at least part of the multilayer film between the steps (d-1) and (d-2) in the method of manufacturing a semiconductor device according to the fifteenth aspect.

In the manufacturing method according to the sixteenth aspect, ions of nitrogen or the like are directly implanted into a portion where a bird's beak is formed by oblique rotational implantation, whereby the interface state density can be further effectively reduced.

According to a seventeenth aspect of the present invention, at least part in the step (i) includes the nitride semiconductor film in the method of manufacturing a semiconductor device according to the fifteenth or sixteenth aspect.

According to an eighteenth aspect of the present invention, the multilayer film further includes a polycrystalline semiconductor film held between the oxide semiconductor film and the nitride semiconductor film, and at least part in the step (i) includes the polycrystalline semiconductor film in the method of manufacturing a semiconductor device according to any of the fifteenth to seventeenth aspects.

According to a nineteenth aspect of the present invention, the multilayer film further includes a polycrystalline semiconductor film held between the oxide semiconductor film and the nitride semiconductor film, and the step (i) includes a step (i-1) of implanting nitrogen, halogen or nitrogen halide into the polycrystalline semiconductor film before the nitride semiconductor film included in the multilayer film is formed in the step (b) in the method of manufacturing a semiconductor device according to the fifteenth aspect.

A method of manufacturing a semiconductor device according to a twentieth aspect of the present invention comprises steps of (a) preparing a semiconductor substrate having a main surface, (b) forming a multilayer film including an oxide semiconductor film and a nitride semiconductor film located thereon on the main surface of the semiconductor substrate, (c) patterning the nitride semiconductor film thereby selectively forming an opening having a shape separating the main surface into a plurality of regions in the nitride semiconductor film, (d) executing etching through the patterned nitride semiconductor film employed as a mask for selectively removing a portion immediately under the opening thereby forming a trench in a portion of the semiconductor substrate immediately under the opening, (e) forming an inner wall insulator film including an oxide semiconductor film coming into contact with an inner wall of the trench on the inner wall, (f) filling the trench with an insulation after the step (e), (g) removing the multilayer film at least after the step (e), (h) implanting nitrogen, halogen or nitrogen halide into the insulation at least after the step (f), and (i) forming a component of a semiconductor element on each of the plurality of regions separated from each other by the trench in the main surface of the semiconductor substrate.

In the manufacturing method according to the twentieth aspect, nitrogen, halogen or nitrogen halide is implanted into the insulation charged into the trench, so that the implanted element thermally diffuses due to heat treatment performed in some later step, to reach a portion close to a bird's beak on the upper end of the element isolation structure or the interface between the oxide semiconductor film and the semiconductor substrate. Consequently, the interface state density is reduced in this region, to reduce dispersion of the characteristics of the semiconductor element.

A method of manufacturing a semiconductor device according to a twenty-first aspect of the present invention comprises steps of (a) preparing a semiconductor substrate having a main surface, (b) forming a multilayer film including an oxide semiconductor film and a nitride semiconductor film located thereon on the main surface of the semiconductor substrate, (c) patterning the nitride semiconductor film thereby selectively forming an opening having a shape separating the main surface into a plurality of regions in the nitride semiconductor film, (d) executing etching through the patterned nitride semiconductor film employed as a mask for selectively removing a portion immediately under the opening thereby forming a trench in a portion of the semiconductor substrate immediately under the opening, (e) forming an oxide semiconductor film on an inner wall of the trench, (f) forming a nitride semiconductor film on the oxide semiconductor film formed on the inner wall, (g) filling the trench with a fluorine-containing insulation after the step (f), (h) removing the multilayer film at least after the step (f), and (i) forming a component of a semiconductor element on each of the plurality of regions separated from each other by the trench in the main surface of the semiconductor substrate.

In the manufacturing method according to the twenty-first aspect, the trench is filled with the fluorine-containing insulation, thereby reducing the parasitic capacitance between the semiconductor elements isolated by the element isolation structure. Further, the nitride semiconductor film suppresses diffusion of an oxidant, thereby suppressing oxidation on the interface between the semiconductor substrate and the element isolation structure in thermal oxidation performed in the step of forming the element of the semiconductor element or the like. Thus, occurrence of oxidation-induced defects is suppressed.

A first object of the present invention is to provide a semiconductor device having no depression part on an end of an STI structure with small reduction of the area of an active region caused by a bird's beak and a method of manufacturing the same. A second object of the present invention is to provide a semiconductor device capable of reducing an interface state on the interface between an STI structure and a semiconductor substrate thereby improving reliability (hot carrier resistance etc.) of a gate insulator film on a gate end of a MOSFET in the gate width direction, for example, and a method of manufacturing the same. A third object of the present invention is to provide a semiconductor device capable of reducing the density of defects introduced into the interface between an STI structure and a semiconductor substrate and a method of manufacturing the same. A fourth object of the present invention is to provide a semiconductor device capable of reducing parasitic capacitance between active regions holding an STI structure therebetween and a method of manufacturing the same.

Japanese Patent Laying-Open Gazette No. 9-82794 (1997) (hereinafter referred to as literature 1), Japanese Patent Laying-Open Gazette No. 8-213382 (1996) (hereinafter referred to as literature 2), "Symposium on VLSI Technology, Digest of Technical Papers" (1999) pp. 159–160 (hereinafter referred to as literature 3), Japanese Patent Laying-Open Gazette No. 11-186378 (1999) (hereinafter referred to as literature 4) and U.S. Pat. No. 5,447,884 (hereinafter referred to as literature 5) are known as literature disclosing techniques related to the present invention. Superiority of the present invention over the prior art is described in detail with reference to embodiments.

The foregoing and other objects, features, aspects and advantages of the present invention will become more apparent from the following detailed description of the present invention when taken in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

1. Schematic Structure of Semiconductor Device

Figure 1:
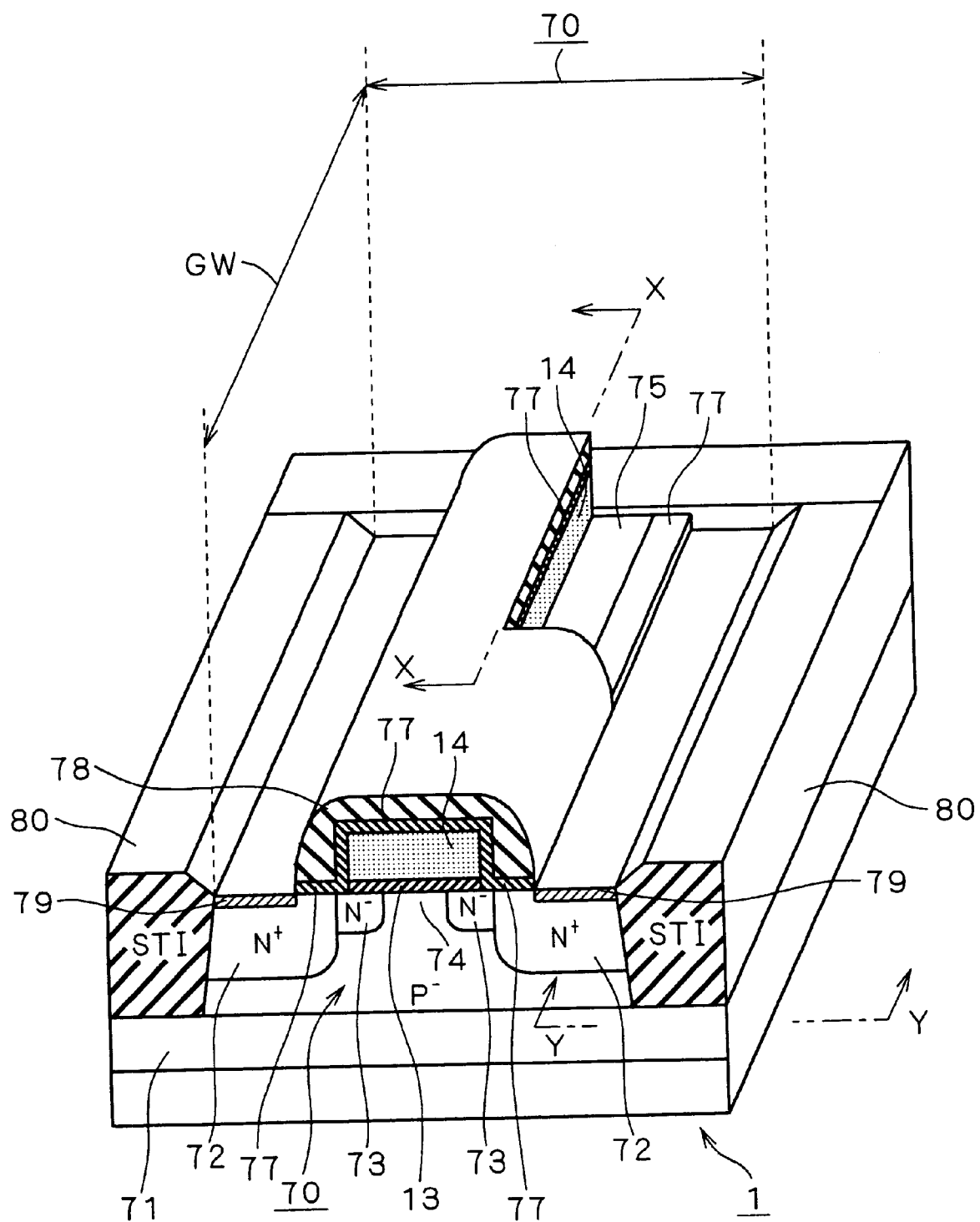
FIG. 1 is a partially fragmented perspective view of a semiconductor device according to each embodiment of the present invention.

FIG. 1 is a partially fragmented perspective view schematically showing the structure of a semiconductor device according to each embodiment of the present invention. FIG. 1 representatively illustrates one of a number of semiconductor elements included in the semiconductor device formed as an integrated circuit. While the following description is made with reference to a semiconductor element formed by a MOSFET (particularly an N-channel MOSFET) and a semiconductor substrate formed by a silicon substrate, it goes without saying that the present invention is not restricted to these.

The semiconductor device shown in FIG. 1 comprises a silicon substrate 1, and a plurality of P-type active regions 70 are formed in the main surface thereof. An STI structure (STI element isolation structure) 80 selectively formed in the main surface of the silicon substrate 1 isolates the plurality of active regions 70 from each other. N-channel MOSFETs are formed on the individual active regions 70 isolated from each other.

A pair of N$^-$-type source/drain regions 72 and a pair of N$^-$-type LDD (lightly doped drain) regions 73 are selectively formed in each active region 70 to be selectively exposed on the main surface. The pair of LDD regions 73 are selectively formed to be opposed to each other through a P$^-$-type channel region 74 selectively exposed on the main surface, and the pair of source/drain regions 72 are formed on the outer sides of the pair of LDD regions 73 as viewed from the channel region 74. A gate electrode 14 is opposed to the exposed surface of the channel region 74 through a gate insulator film 13. The source/drain regions 72, the LDD regions 73, the channel region 74 and the gate electrode 14 extend along one side of the active region 70 having a rectangular plane section from one end to another end in the form of strips. Therefore, the width of the aforementioned side of the active region 70 corresponds to the gate width GW of the MOSFET.

The bottom surface of the active region 70 is covered with a channel stopper 71 coming into contact with the bottom surface of the STI structure 80. Metal silicide layers 79 are formed on the exposed surfaces of the source/drain regions 72. An insulator film 77 covers portions of the main surface covered with neither the gate insulator film 13 nor the metal silicide layers 79 and the gate electrode 14, and an insulator layer 78 covers this insulator film 77.

As described below in detail, the principal features of a semiconductor device and a method of manufacturing the same according to each embodiment reside in the structure of the STI structure 80 and a method of forming the same. Step diagrams referred to with reference to each of the following embodiments are sectional views taken along the line X—X parallel to the direction of the gate width GW shown in FIG. 1 or the line Y—Y parallel to the gate length direction perpendicular thereto, showing steps of manufacturing the semiconductor device.

2. Embodiment 1

The feature of a semiconductor device and a method of manufacturing the same according to an embodiment 1 of the present invention resides in that the inner walls of a silicon dioxide film and a polysilicon film (polycrystalline silicon film) serving as masks for anisotropic etching employed in a manufacturing step of forming a trench for an STI structure in the main surface of a semiconductor substrate are oxynitrided in advance of the anisotropic etching. This characteristic manufacturing method is now described with reference to FIGS. 2 to 12 showing steps thereof.

Figure 2:
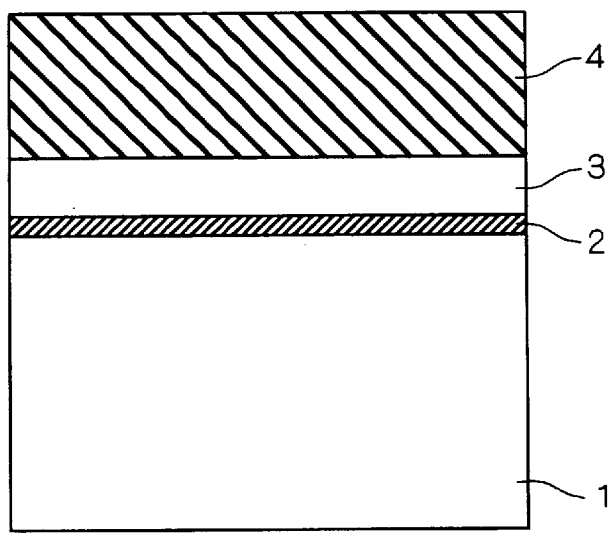
FIGS. 2 to 12 illustrate steps of manufacturing a semiconductor device according to an embodiment 1 of the present invention.

According to this manufacturing method, the step shown in FIG. 2 is first carried out. In the step shown in FIG. 2, a silicon substrate 1 having a main surface is first prepared. Thereafter the silicon substrate 1 is thermally oxidized, thereby forming a silicon dioxide (SiO$_2$) film 2 on the main surface in a thickness of about 10 nm to 20 nm. Then, a CVD (chemical vapor deposition) apparatus is employed for forming a polysilicon film 3 of about 30 nm to 50 nm in thickness on the silicon dioxide film 2 and thereafter forming a silicon nitride ($Si_3N_4$) film 4 of about 100 nm to 250 nm in thickness.

Figure 3:
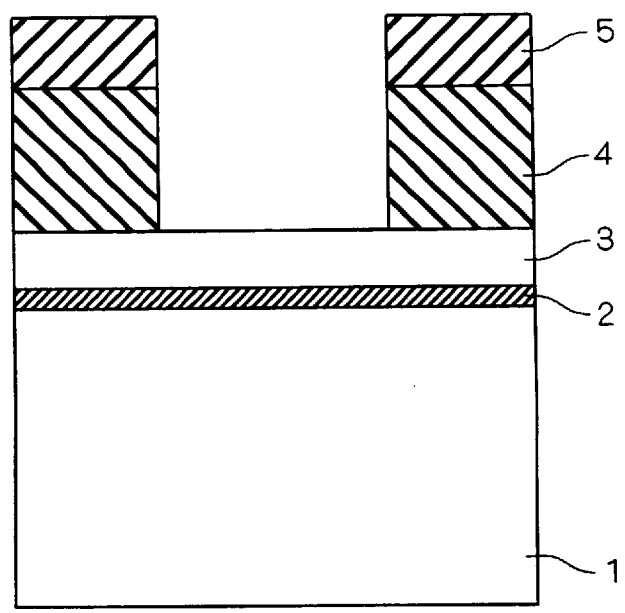

Then, the step shown in FIG. 3 is carried out. In the step shown in FIG. 3, resist is first applied onto the silicon nitride film 4 and thereafter patterned through a transfer step, for forming a resist mask 5. Thereafter anisotropic etching is executed through the resist mask 5 serving as a mask (screen), thereby selectively removing the silicon nitride film 4. The ratio between the etching rates for the silicon nitride film 4 and the polysilicon film 3 is sufficiently high and hence the anisotropic etching stops on the upper surface of the polysilicon film 3.

An opening selectively formed in the silicon nitride film 4 by the patterning defines the pattern of a trench formed in the silicon substrate 1, as described later. Therefore, the opening of the silicon nitride film 4 is formed in a shape dividing the main surface of the silicon substrate 1 into a plurality of regions.

Figure 4:
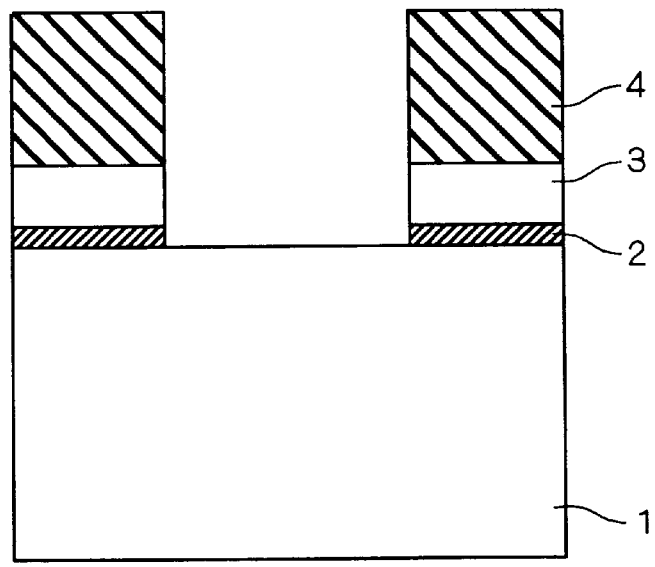

In the subsequent step shown in FIG. 4, reactive ion etching is executed through the patterned silicon nitride mask 4 serving as a hard mask after removing the resist mask 5, thereby selectively removing the polysilicon film 3 and the silicon dioxide film 2 until the main surface of the silicon substrate 1 is exposed. Needless to say, etchants employed for the anisotropic etching are properly changed following stepwise change of the types of the films to be removed.

Figure 5:
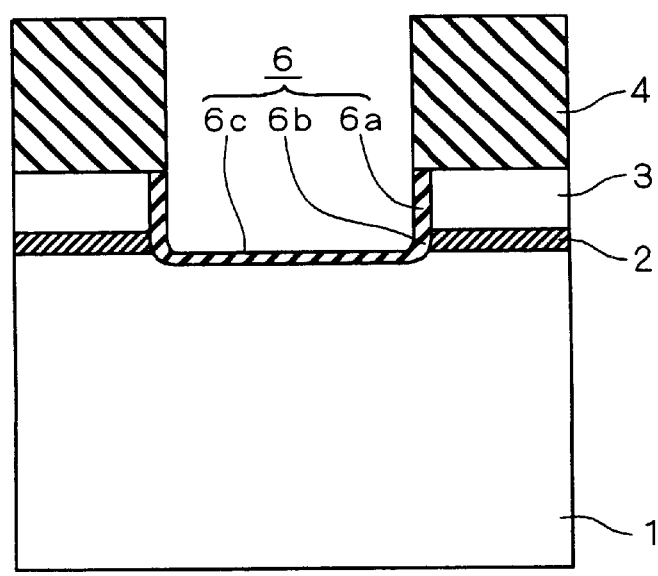

Then, the side wall surfaces of the polysilicon film 3 and the silicon dioxide film 2 exposed in a cavity and the surface of the silicon substrate 1 exposed in the cavity are oxynitrided in a mixed gas atmosphere of $NO/O_2$, for example, thereby forming a silicon oxynitride (SiON) film 6 (films 6a to 6c) to cover these side wall surfaces and the surface, as shown in FIG. 5. The diffusion rate of an oxidant is higher in polysilicon than that in single-crystalline silicon, and hence the thickness of the silicon oxynitride film 6a formed by oxynitriding the side wall of the polysilicon film 3 is larger than that of the silicon oxynitride film 6c formed on the surface of the silicon substrate 1.

In the oxynitridation, $N_2O$ gas, $NH_3$ gas or $NF_3$ may be employed in place of the NO gas. Alternatively, oxynitridation may be performed while changing the gas forming the atmosphere in order of $N_2$, dry $O_2$ (or $H_2O$) and $N_2$, or by a method of performing oxidation in an $O_2$ atmosphere and thereafter performing oxynitridation in an NO atmosphere or a method of performing oxynitridation in an NO atmosphere and thereafter performing oxidation in an $O_2$.

Figure 6:
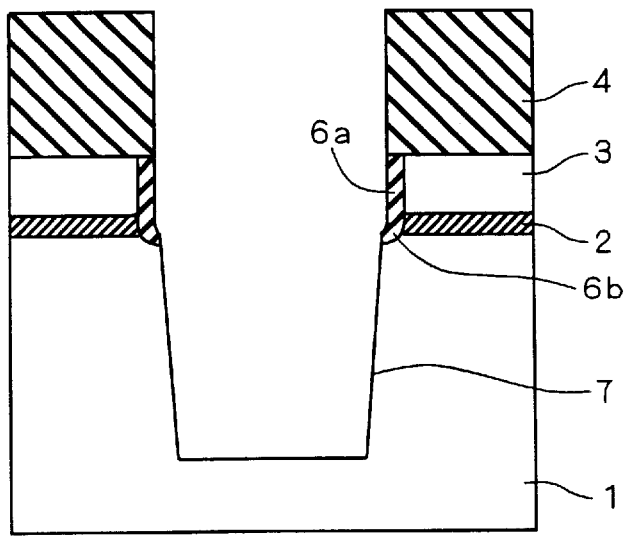

Then, reactive ion etching is executed through the patterned silicon nitride film 4 serving as a hard mask, thereby selectively removing the silicon oxynitride film 6 and the silicon substrate 1, as shown in FIG. 6. Thus, a trench 7 having a depth of about 100 nm to 300 nm is formed in the silicon substrate 1. When anisotropically etching the silicon substrate 1, the side wall of the polysilicon film 3 will not retreat due to the silicon oxynitride film 6a. This is because the etching selection ratio between silicon and the oxynitride film 6a is sufficiently larger than that between silicon and polysilicon. Therefore, it is possible to form an active region in the silicon substrate 1 in a size along the dimensions of the hard mask of the silicon nitride film 4.

Figure 7:
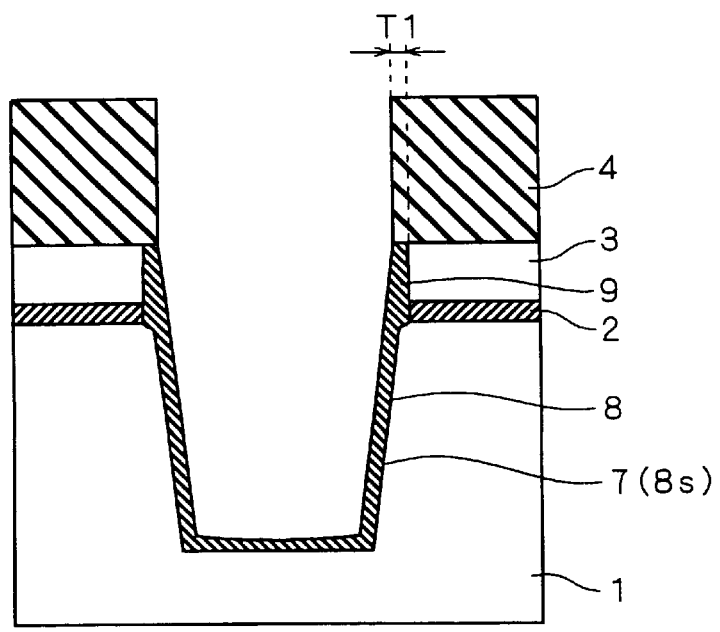
Figure 8:
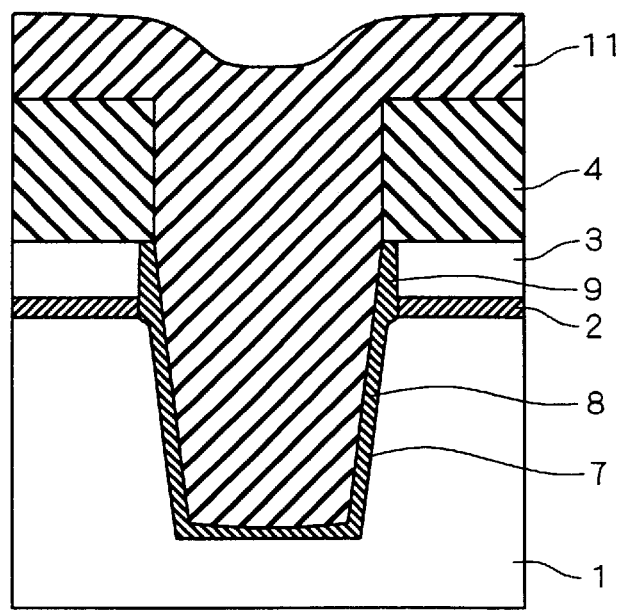

Then, an oxide film serving as an inner wall insulator film 8 is formed in an HCl atmosphere or a dry $O_2$ atmosphere, for example, in a thickness of about 30 nm, as shown in FIG. 7. At this time, a bird's beak 9 is formed on the inner walls of the polysilicon film 3 and the silicon dioxide film 2.

However, the silicon oxynitride films 6a and 6b suppress diffusion of an oxidant on the inner walls of the polysilicon film 3 and the silicon dioxide film 2, thereby suppressing the bird's beak length (thickness of the bird's beak 9) T1. Therefore, the area of the active region in the silicon substrate 1 is not remarkably reduced by the bird's beak 9. The atmosphere for forming the inner wall insulator film 8 may alternatively be prepared from wet $O_2$ or $H_2O/O_2$. Further, the inner wall insulator film 8 may be formed by a multilayer film of a silicon dioxide film and a silicon oxynitride film (silicon dioxide film/silicon oxynitride film, silicon dioxide film/silicon oxynitride film/silicon dioxide film or the like in order from the silicon substrate 1 toward the inner part of the STI structure) prepared in such an atmosphere.

When the inner wall insulator film 8 is prepared from silicon dioxide, the interface state density on the interface 8s between the inner wall insulator film 8 and the silicon substrate 1 is lower than that observed when the inner wall insulator film 8 is prepared from silicon dioxide. Even when forming the inner wall insulator film 8 by a multilayer film, therefore, the film forming the interface 8s with the silicon substrate 1 is prepared from silicon dioxide ($SiO_2$).

When the inner wall insulator film 8 has a single-layer structure of only an $SiO_2$ layer, the oxidant diffuses into an insulation filled into the STI structure to reach the silicon substrate 1 coming into contact with the side wall and the bottom surface of the STI structure in a step of forming a gate oxide film on the active region after forming the STI structure, to cause new oxidation. At this time, oxidation-induced stress occurs to cause dislocations or point defects in the silicon substrate 1, disadvantageously resulting in a large leakage current also in a stand-by state. This causes a serious problem particularly in a flash memory (EEPROM) or the like having a high oxidation temperature and a long oxidation time for forming a gate oxide film.

In order to avoid this problem, it is necessary not to cause oxidation on the side wall and the bottom surface of the STI structure, i.e., not to allow the oxidant to reach the interface between the STI structure and the silicon substrate 1 in a gate oxidation step. A method of implementing this is to bring the inner wall insulator film 8 into a two-layer structure of $SiO_2$/SiON. SiON, suppressing diffusion of the oxidant, can suppress occurrence of oxidation-inductive stress in the gate oxidation step.

For the aforementioned reason, the material for the inner wall insulator film 8, which may be prepared from either a single-layer film of $SiO_2$ or a multilayer film of $SiO_2$/SiON, is preferably prepared from a two-layer film of $SiO_2$/SiON or a three-layer film of $SiO_2$/SiON/$SiO_2$ from the silicon substrate 1 toward the inner part of the STI structure.

Nitrogen contained in the silicon oxynitride film 6 thermally diffuses into the region of silicon dioxide in an inner wall oxidation step or a later step of thermal shrinking heat treatment, and hence it follows that nitrogen atoms are present in the bird's beak 9 with certain concentration distribution. This distribution depends on the heat treatment step.

Then, the trench 7 is filled with a filled insulation 11. When executing a deposition method simultaneously performing etching and film formation with the aforementioned HDP-CVD, for example, it is possible to charge the trench 7 with the filled insulation 11 having a thickness of about 500 nm to 700 nm while hardly forming a clearance (seam) in the trench 7. The filled insulation 11 is deposited until the same covers the upper surface of the silicon nitride film 4.

The material for the filled insulation 11 may be prepared from TEOS, silicon dioxide or silicon oxynitride, so far as the same is an insulation. In consideration of occurrence of stress resulting from the difference between thermal expansion coefficients of respective materials in the later thermal shrinking step, it is desirable to select a material having a thermal expansion coefficient approximate to that of silicon. The material for the filled insulation 11 may be decided on the basis of factors such as chargeability in the trench 7, the insulation property, the dielectric constant and the like.

Silicon oxynitride (SiON) is known as an insulation having a thermal expansion coefficient approximate to that of silicon. However, silicon oxynitride has a relatively high relative dielectric constant of about 4 to 6, depending on the nitrogen concentration. When the filled insulation 11 has a large relative dielectric constant, the parasitic coupling capacitance between source/drain regions of adjacent MOSFETs formed through the STI is increased to reduce the switching rate of the MOSFETs. Consequently, the operating speed of the circuit is somewhat reduced.

When the filled insulation 11 is prepared from SiOF, the relative dielectric constant thereof is 3.3 to 3.5, which is smaller as compared with $SiO_2$ (relative dielectric constant: 3.7 to 3.9) or TEOS (relative dielectric constant: 3.7 to 3.9), and hence the parasitic coupling capacitance is reduced as compared with the conventional STI structure. When the relative dielectric constant of the filled insulation 11 is low, the parasitic coupling capacitance between a metal wire (not shown) formed on the STI structure and the silicon substrate 1 is also reduced, to advantageously reduce a delay time of an electric signal transmitted through the metal wire. Further, the insulation property of SiOF is substantially identical to that of $SiO_2$, to cause no problem. In addition, the thermal expansion coefficient of SiOF is also substantially identical to that of $SiO_2$, to cause no problem although SiOF is inferior to SiON.

For the aforementioned reasons, the optimum material for the filled insulation 11, which may be prepared from any of $SiO_2$, TEOS, SiON and SiOF, is SiOF when attaching importance to increase of the operating speed of the circuit by reduction of the parasitic capacitance.

Fluorosilicate glass (FSG), hydrogen silsesquioxane (HSQ), fluorinated polysilicon, polyphenylquinoxaline polymer, fluoropolyimide, amorphous fluorocarbon (a-C:F), methylpolysiloxane (MPS), polyarylene ether (PAE), porous $SiO_2$ or the like is known as the material for an insulator film having a low dielectric constant in addition to SiOF, and the relative dielectric constant thereof is about 2.0 to 3.5. This material may be selected for the filled insulation 11.

Figure 9:
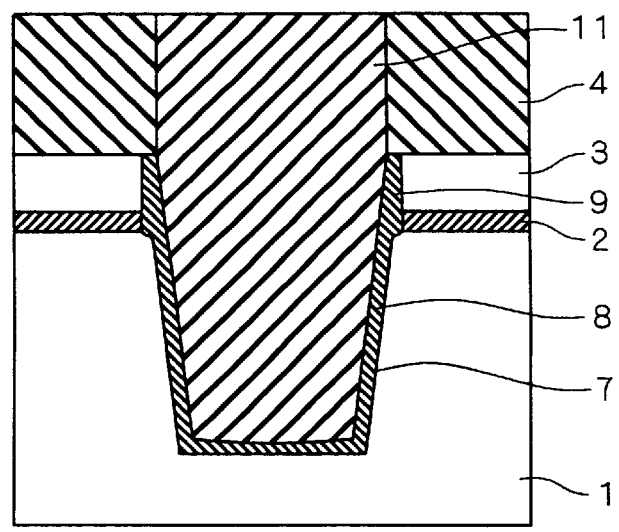

Then, CMP (chemical mechanical polishing) is executed through the silicon nitride film 4 serving as a stopper, thereby flattening the upper surface of the filled insulation 11, as shown in FIG. 9.

Figure 10:
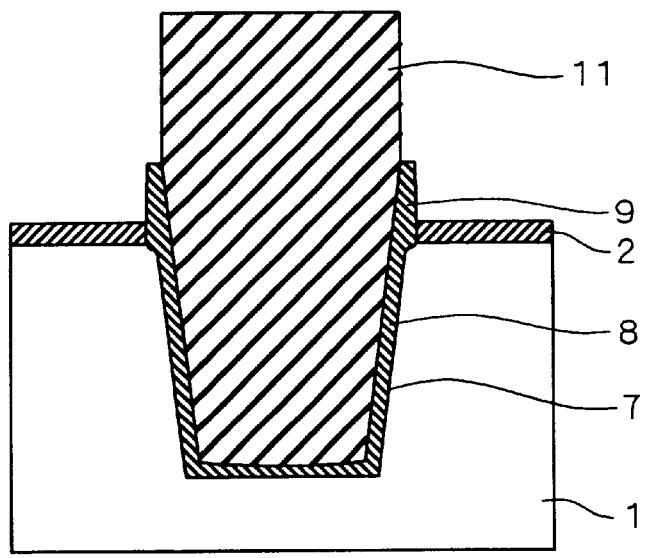

Then, the silicon nitride film 4 and the polysilicon film 3 are removed by etching, as shown in FIG. 10. In the bird's beak 9 including at least parts of the silicon oxynitride films 6a and 6b, part formed on the side wall of the polysilicon film 3 is connected with the silicon nitride film 4. When removal of the silicon nitride film 4 is completed in the step of removing the silicon nitride film 4 by etching employing hot phosphoric acid, therefore, the hot phosphoric acid reaches the silicon oxynitride film 6a (FIG. 6) formed on the side wall of the polysilicon film 3.

Figure 56:
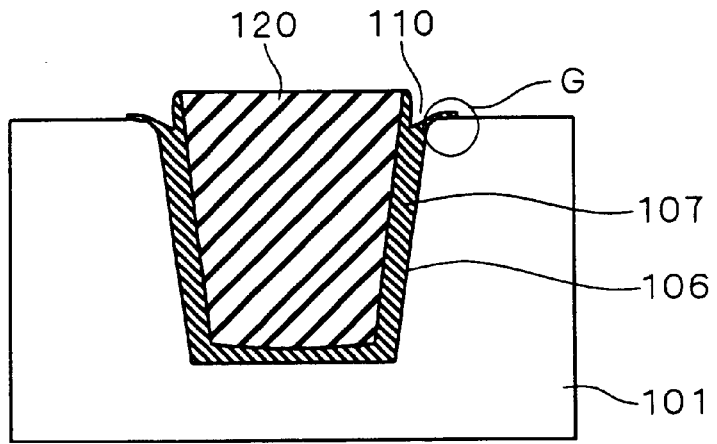
Figure 57:
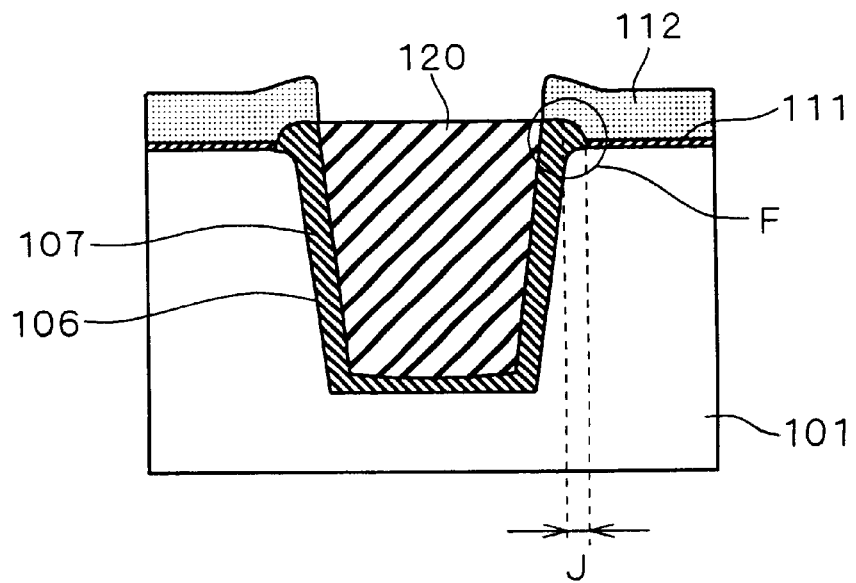
Figure 58:
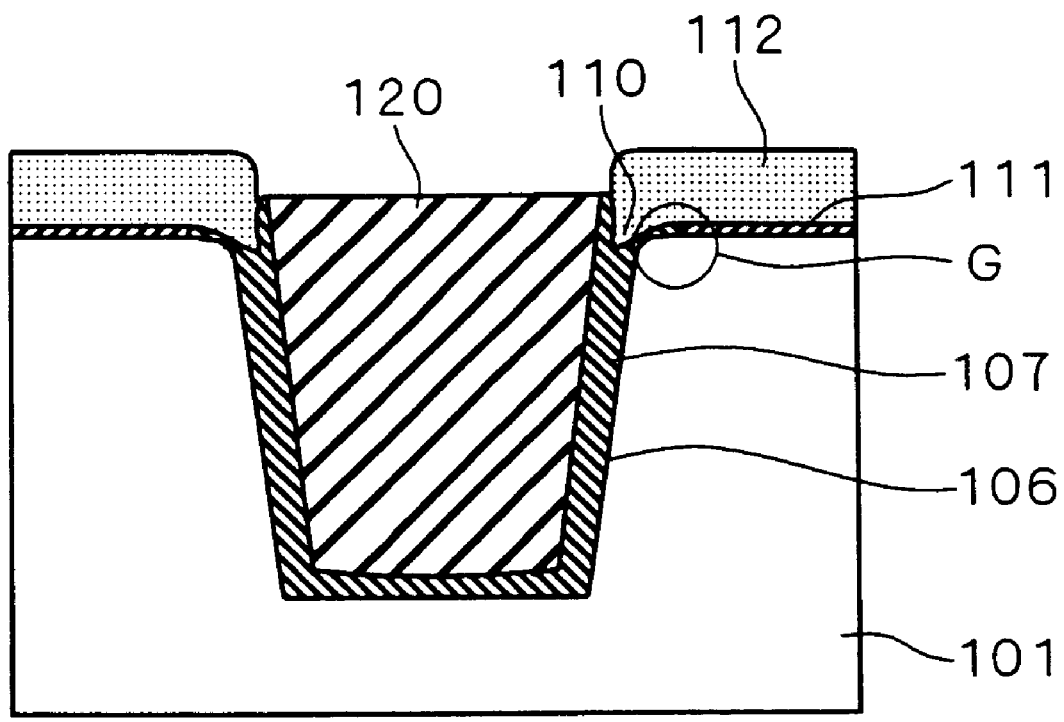
Figure 59:
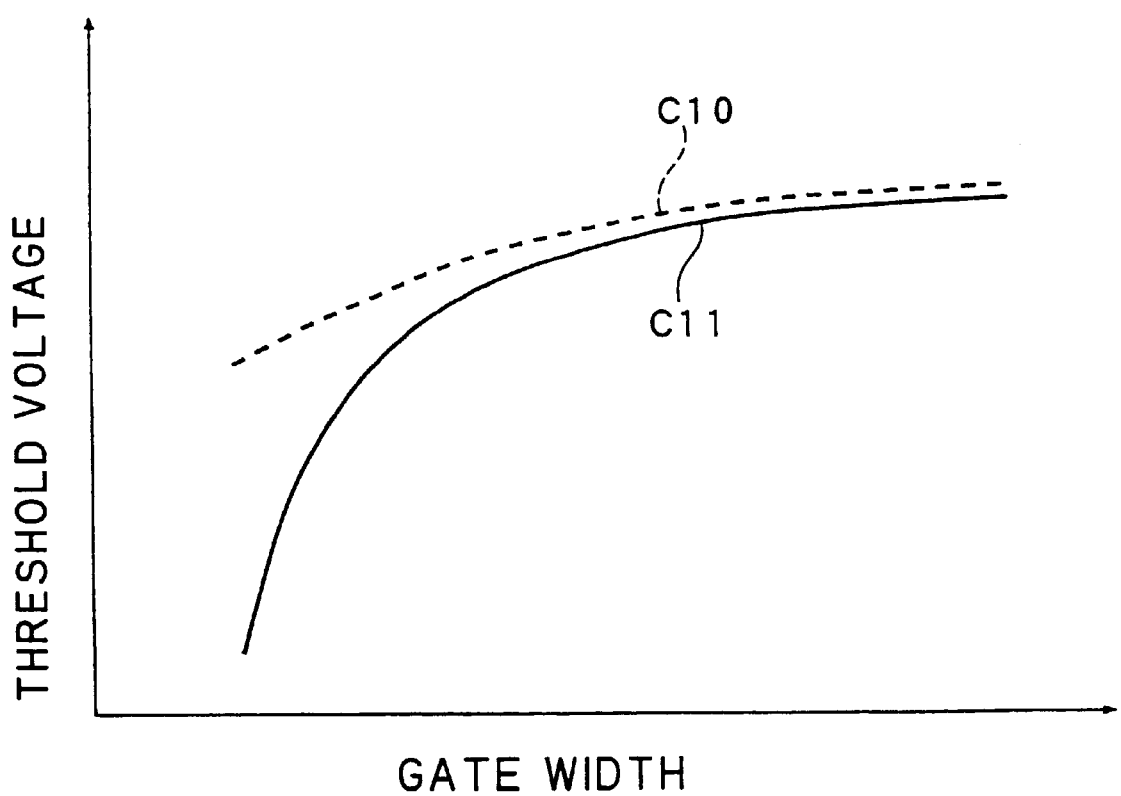
FIGS. 59 and 60 are explanatory diagrams of the conventional semiconductor device.

Consequently, the silicon oxynitride film 6a is partially removed by etching, while the silicon oxynitride film 6 in the bird's beak 9 can be left unetched even if the etching is executed to leave no residue (part left unetched) of the silicon nitride film 4 by overetching since the etching rate of the hot phosphoric acid for the silicon oxynitride film 6 is smaller than that for the silicon nitride film 4. Therefore, no depressed part 110 (FIG. 56) is formed even when the inner wall insulator film 8 has a small thickness.

After the silicon nitride film 4 is removed by etching, etching is executed with diluted aqueous ammonia ($NH_4OH$), for example, thereby removing the polysilicon film 3. With respect to this etchant, the selection ratio between polysilicon and SiON is large. The bird's beak 9 formed on the side wall of the polysilicon film 3, consisting of a mixture of silicon dioxide and silicon oxynitride, is left substantially unetched.

Figure 11:
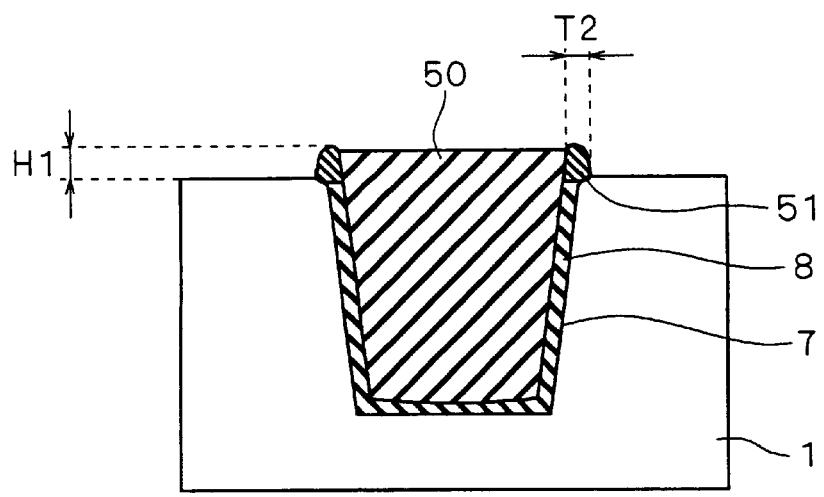

Then, etching is executed through hydrofluoric acid (HF), thereby removing part of the filled insulation 11 and the silicon dioxide film 2, as shown in FIG. 11. Thus, a filled insulation 50 is prepared from the filled insulation 11. At this time, the bird's beak 9 consisting of the mixture of silicon oxynitride and silicon dioxide is partially removed by etching and left as a bird's beak 51 although the etching rate therefor is smaller than those for the silicon dioxide film 2 and the filled insulation 11. In other words, the etching rate of hydrofluoric acid for silicon dioxide is larger than that for SiON. Stress relaxation can be implemented by adjusting the nitrogen concentration in the silicon oxynitride film 6 thereby reducing the bird's beak length T2 of the bird's beak 51 and rounding the shape of the upper end of the STI structure (opening of the trench 7) by the bird's beak 51.

After the step shown in FIG. 11 is completed, an underlayer oxide film is formed in a thickness of about 10 nm to 20 nm for covering the main surface of the silicon substrate 1, and thereafter heat treatment is performed in a nitrogen atmosphere or an argon atmosphere at a temperature of about 1050° C. to 1200° C., in order to thermally shrink silicon dioxide forming the filled insulation 50 and densifying the same. Under 1 atm., silicon dioxide causes viscous flow to implement stress relaxation when heat-treated at a temperature exceeding 950° C. However, thermal stress resulting from the difference between the thermal expansion coefficients of the filled insulation 50 and the silicon substrate 1 is increased as the heat treatment temperature is increased, and hence stress relaxation by viscous flow of the filled insulation 50 and increase in the stress resulting from thermal stress in the silicon substrate 1 is in trade-off relation to each other. As the width (pitch) of the STI structure or the active region is reduced, therefore, thermal stress becomes dominant to disadvantageously cause defects or dislocations in the silicon substrate 1.

When the pitch is narrow, therefore, thermal shrinking by low-temperature heat treatment under a wet oxidation atmosphere is effective in order to suppress thermal stress. However, oxidation-induced stress is caused when the bottom surface or the side wall of the STI structure is oxidized as described above, and hence a two-layer film of $SiO_2$/SiON is desirable as the inner wall insulator film 8, in order to suppress this.

It is also possible to densify the filled insulation 11 by another thermal shrinking method of performing heat treatment under a relatively low temperature of about 500° C. to 1000° C. in a high-pressure inert gas atmosphere (nitrogen atmosphere, argon atmosphere, neon atmosphere, helium atmosphere, krypton atmosphere, xenon atmosphere or the like). In this method, no oxidation-induced stress is caused since the side wall and the bottom surface of the STI structure are not oxidized while thermal stress hardly occurs due to the low temperature, whereby densification of the filled insulation 50 for the STI structure and reduction of defect density in the silicon substrate 1 can be compatibly implemented. After the thermal shrinking step, well-known well implantation, channel stopper implantation and channel implantation are executed and the aforementioned underlayer oxide film is removed by etching.

Figure 12:
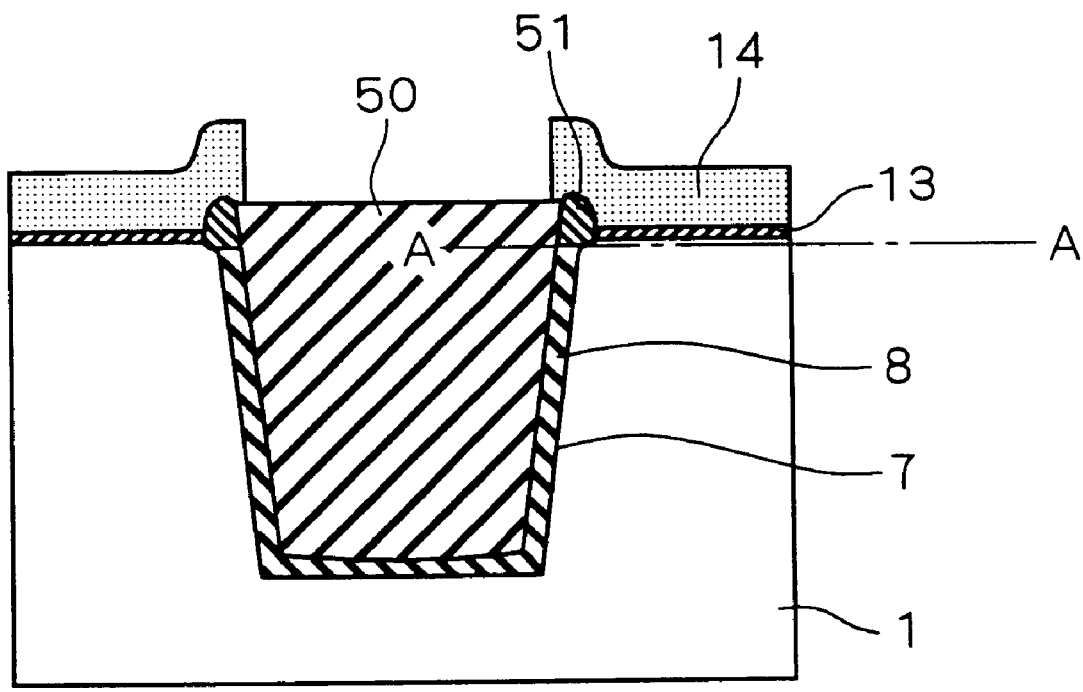

Thereafter an N-channel MOSFET is formed as the semiconductor element, as shown in FIG. 12. The main surface of the silicon substrate 1 is thermally oxidized thereby forming a silicon dioxide film as the gate insulator film 13, and thereafter the gate electrode 14 is deposited. The remaining elements of the MOSFET including the source/drain regions 72 and the LDD regions 73 are also formed although these elements are not shown, thereby completing the semiconductor device shown in FIG. 1.

Figure 13:
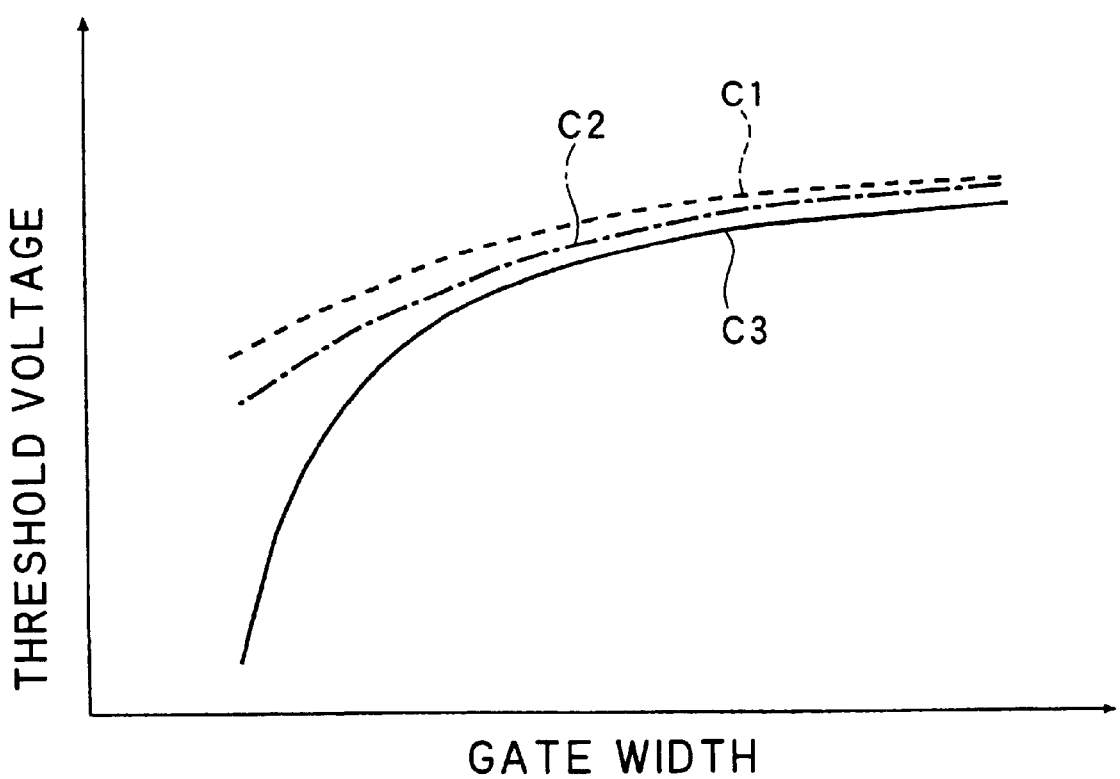
FIGS. 13 to 15 are explanatory diagrams of the semiconductor device according to the embodiment 1.

In the structure shown in FIG. 12, the width of the bird's beak 51 (the height H1 of the bird's beak 51 from the main surface of the silicon substrate 1 shown in FIG. 11) is small and no depressed part 110 (FIG. 56) is formed regardless of the thickness (bird's beak length) of the bird's beak 51, whereby a more gradual inverse narrow channel characteristic (curve C1) is obtained as compared with the conventional device (curve C3) having the depressed part 110, as shown in a graph of FIG. 13. The bird's beak length of the bird's beak 51 is smaller than that of the conventional device, whereby the inverse narrow channel curve is more gradual also as compared with the conventional device (curve C2) having no depressed part 110.

Figure 60:
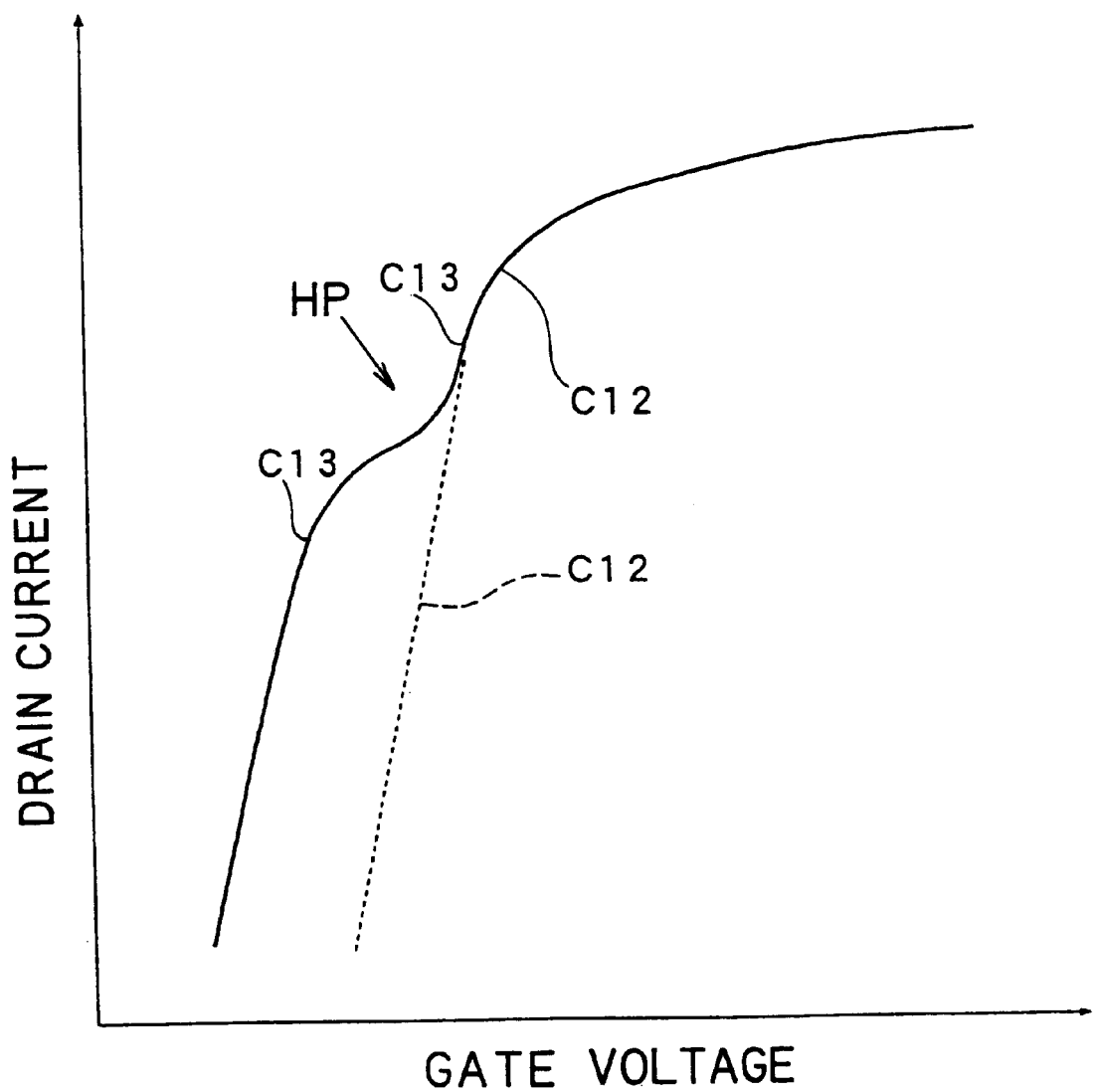

The STI structure shown in FIG. 12 has no depressed part 110, whereby no hump (FIG. 60) appears on the curve of a drain current-to-gate voltage characteristic although this is not shown in FIG. 13. In the STI structure shown in FIG. 12, further, the width of the active region 70 (FIG. 1) is increased, whereby the effective gate width GW (FIG. 1) is increased to attain an advantage of increasing a drain current.

Figure 14:
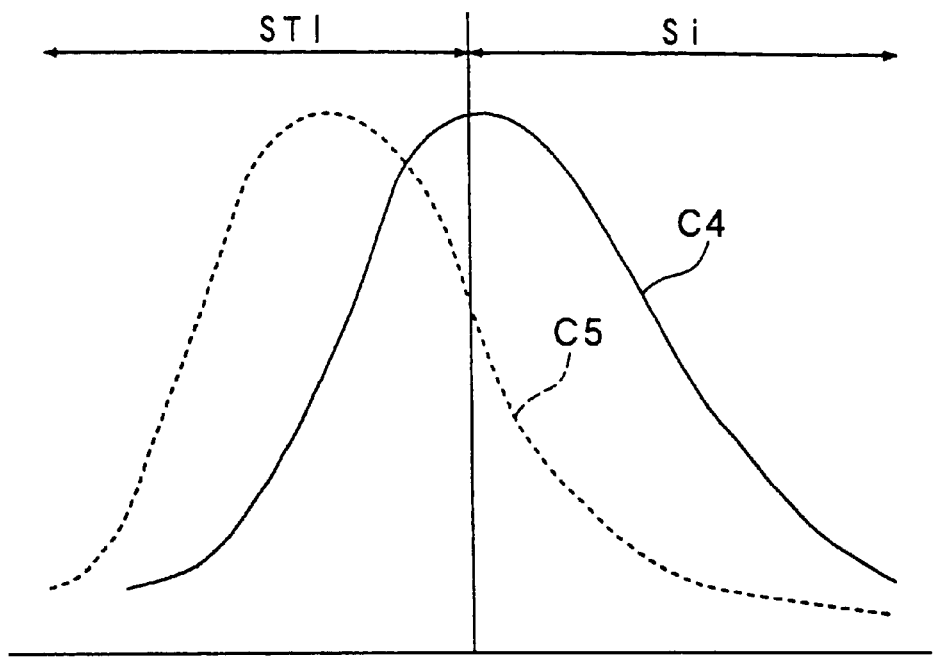

In relation to the structure shown in FIG. 5, the case of forming the silicon oxynitride film 6 by performing oxidation in a dry $O_2$ atmosphere and thereafter performing oxynitridation in an SiON atmosphere is compared with the case of forming the silicon oxynitride film 6 by performing oxynitridation in an SiON atmosphere and thereafter performing oxidation in a dry $O_2$ atmosphere, for example. FIG. 14 is a graph showing nitrogen concentration distribution along the line A—A in the structure of the completed STI structure shown in FIG. 12. When performing oxidation in an $O_2$ atmosphere and thereafter performing oxynitridation in an NO atmosphere, distribution of the nitrogen concentration on the SiON/Si interface is expressed in a curve C4. In other words, the peak of the nitrogen concentration distribution is present in the vicinity of the interface. This is because NO serving as an oxidant diffuses in an $SiO_2$ film formed in the $O_2$ atmosphere to react on the silicon interface.

When performing oxynitridation in an NO atmosphere and thereafter performing oxidation in an $O_2$ atmosphere, on the other hand, $O_2$ serving as an oxidant diffuses in SiON formed in the NO atmosphere to react on the silicon interface, and hence the peak of the nitrogen concentration retreats to the side of silicon nitride as shown in a curve C5 of FIG. 14, and it follows that the nitrogen concentration in the silicon substrate 1 is reduced as a result. When the distribution shown by the curve C4 is implemented, the peak of the nitrogen concentration is located on the interface and hence the oxidation rate in the subsequent step of forming the oxide film as the gate insulator film 13 is smaller than that in the case of implementing the distribution shown by the curve C5. When the distribution of the curve C4 is implemented, therefore, the thickness of the gate insulator film 13 in the vicinity of an end of the STI structure is somewhat smaller than that of the gate insulator film 13 at the center of the active region 70. When the distribution of the curve C5 is implemented, the nitrogen concentration in the silicon substrate 1 is low and hence this problem can be avoided.

It is possible to avoid such a problem that the oxidant diffuses in the STI structure when performing gate oxidation to oxidize a portion of the silicon substrate 1 close to the bird's beak 51 located on the upper end of the STI structure and result in stress whichever distribution of the two curves C4 and C5 is implemented since nitrogen suppresses diffusion of the oxidant. When the oxidation step is performed at a high temperature over a long time, diffusion of the oxidant causes limitation of oxidative reaction and hence the distribution of the curve C5 having higher nitrogen concentration in the oxynitride film 6 is advantageous in consideration of suppression of diffusion of the oxidant. When the oxidation step is performed at a low temperature for a short time, the distribution of the curve C4 having higher nitrogen concentration on the interface is advantageous since the reaction rate on the interface of the silicon substrate 1 limits. the oxidative reaction.

About 1% of nitrogen contained in the silicon substrate 1 is electrically activated. When activated, nitrogen atoms act as donors. When activated nitrogen atoms are present in the vicinity of the upper end of the STI structure, therefore, electron mobility in an inversion layer formed on a P-type diffusion layer (channel region 74) of an N-channel MOSFET (NMOSFET) is increased. On the other hand, hole mobility in an inversion layer formed on an N-type diffusion layer (channel region 74) of a P-channel MOSFET (PMOSFET) is reduced. In view of the above, it can be said that the distribution of the curve C4 is more desirable for an NMOSFET and the distribution of the curve C5 is more desirable for a PMOSFET.

In view of implementation of a process of keeping the thickness of the gate insulator film 13 uniform in the active region while not much oxidizing a portion of the silicon substrate 1 around the bird's beak 9 of the STI structure in gate oxidation, therefore, it can be said that the distribution of the curve C4 and the distribution of the curve C5 have merits and demerits and are in trade-off relation to each other.

The nitrogen concentration distribution around the SiON/Si interface may be optimized on the basis of the aforementioned conditions. The silicon oxynitride film 6 may be formed by any of the aforementioned methods in order to implement optimization.

Figure 15:
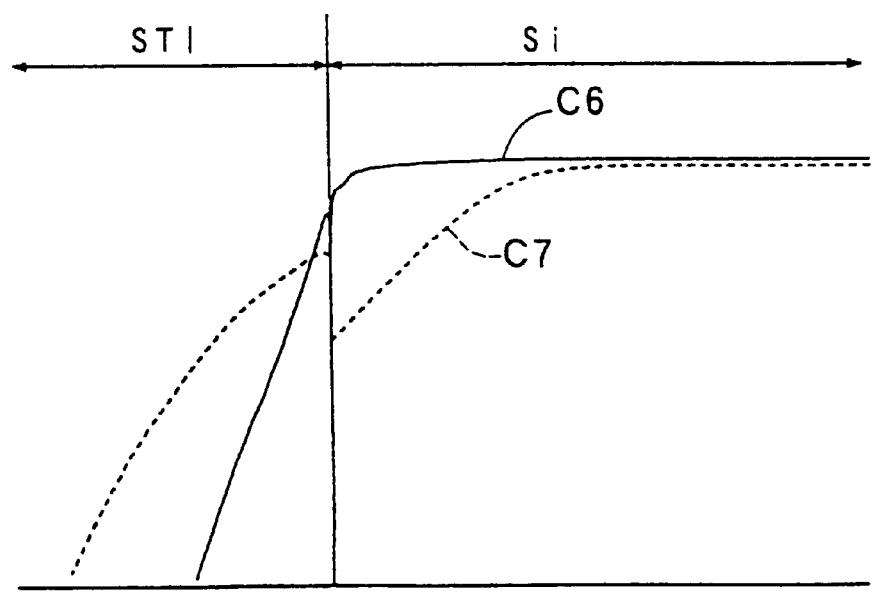

Another reason for the superiority of the structure shown in FIG. 12 over the conventional structure resides in that the region including the silicon oxynitride film 6 is present on the upper end of the STI structure and hence, when a diffusion layer of boron forming the channel region 74 of an NMOSFET is formed in the silicon substrate 1 in contact with the upper end of the STI structure including the silicon oxynitride film 6 and further heat-treated, for example, such a phenomenon that boron on the interface of the side wall of the STI structure segregates from the silicon substrate 1 toward the STI structure is suppressed. For example, it is assumed that FIG. 12 is a sectional view along the direction of the gate width GW of the NMOSFET, i.e., a sectional view taken along the line X—X in FIG. 1. In this case, a graph of FIG. 15 typically expresses boron concentration distribution along the line A—A in FIG. 12.

In the gate oxidation or the subsequent heat treatment performed under the inert gas atmosphere of argon or the like, boron channel-implanted into the silicon substrate 1 segregates around the side wall of the STI structure and its concentration is reduced, as shown in a curve C7. This results in such a phenomenon that the threshold voltage lowers as the gate width GW is reduced, i.e., the inverse narrow channel effect. When forming the side wall of the STI structure by a silicon oxynitride film, this segregation is suppressed as shown in a curve C6, and hence the inverse narrow channel effect is reduced at least as compared with the conventional STI structure.

Segregation is suppressed due to the presence of the silicon oxynitride film on the side wall of the STI structure since (1) the silicon oxynitride film provided in the STI structure suppresses diffusion of the oxidant in gate oxidation to limit oxidative reaction, and (2) while interstitial silicon introduced into the silicon substrate 1 by ion implantation such as channel implantation or source/drain implantation pairs with boron to perform transient enhanced diffusion under the inert gas atmosphere of nitrogen or argon and $SiO_2$ or SiON acts as an absorption factor for the pair or the interstitial silicon so that both are attracted to the end of the STI structure, SiON absorbs these at a rate smaller than that of $SiO_2$.

As described above, the amount of boron entering the STI structure due to thermal diffusion is suppressed when silicon oxynitride is present on the side wall of the STI structure, and hence the breakdown voltage of the STI structure is kept high as compared with a structure having no silicon oxynitride film.

The superiority of the semiconductor device and the method of manufacturing the same according to the embodiment 1 over the prior art disclosed in the aforementioned literature is now described in detail.

Literature 1 discloses a step of forming a silicon nitride film on the side wall of an etched polysilicon film by performing plasma discharge treatment with $N_2$ gas in FIG. 1. However, this literature discloses no technique of executing a step of forming a bird's beak on the upper end of an STI structure by oxidizing the inner wall of a trench after forming a silicon nitride film on the polysilicon film thereby attaining stress relaxation.

When a silicon nitride film is formed on the side wall of the polysilicon film 3 in place of the silicon oxynitride film 6 in the embodiment 1, the silicon nitride film formed on the side wall suppresses thermal oxidation of the polysilicon film 3 in the subsequent step of oxidizing the inner wall. Consequently, the bird's beak 9 is extremely reduced and hence oxidation for rounding the upper end of the trench 7 is so insufficient that sufficient stress relaxation cannot be attained. When removing the silicon nitride film 4 by etching with hot phosphoric acid after charging the trench 7 with the insulation in the subsequent step, the hot phosphoric acid serving as an etchant reaches the silicon nitride film formed on the side wall of the polysilicon film 3 to remove the same, and hence the depressed part 110 is disadvantageously formed on the upper end of the STI structure. Further, the silicon nitride film is formed on the side wall of the polysilicon film 3 by plasma discharge, and hence damage resulting from the plasma discharge is disadvantageously introduced into a portion around the interface between the STI structure and the silicon substrate 1.

The silicon oxynitride film 6 is formed on the side wall of the polysilicon film 3 in the embodiment 1 in order to avoid the aforementioned problems, and it can be said that the semiconductor device having the element isolation structure according to the embodiment 1 and the method of manufacturing the same have superiority over the technique disclosed in literature 1.

Literature 2 discloses a technique of suppressing formation of a bird's beak by implanting nitrogen into the upper end of a trench in a step before filling the trench with an insulator. Referring to FIG. 3 of literature 2, nitrogen is introduced also into an underlayer oxide film located under a mask, and hence there is a possibility of partially forming an oxynitride film after inner wall oxidation. When nitrogen is introduced into the underlayer oxide film or the surface of a silicon substrate by ion implantation, defects are also introduced at the same time, leading to such a problem that a leakage current is increased around an STI structure. According to the method of performing oxynitridation in a gas atmosphere as described with reference to the embodiment 1, the side wall of the mask can advantageously be oxynitrided without introducing defects into the underlayer oxide film or the silicon substrate.

Advantages of employing the silicon oxynitride film 6 reside in (1) the point that the thickness of the silicon dioxide film formed on the polysilicon film 3 in inner wall oxidation, i.e., the bird's beak length can be adjusted by adjusting the nitrogen concentration in silicon oxynitride, (2) the point that the etching selection ratio can be ensured between the silicon nitride film 4 and the silicon oxynitride film 6 with respect to the hot phosphoric acid so that no depressed part is formed on the end of the STI structure, and (3) the point that the silicon oxynitride film 6 is formed by heat treatment through a furnace or the like in the gas atmosphere such as an NO atmosphere and hence the silicon substrate 1 is not damaged by plasma or the like.

3. Modification 1 of Embodiment 1

Figure 16:
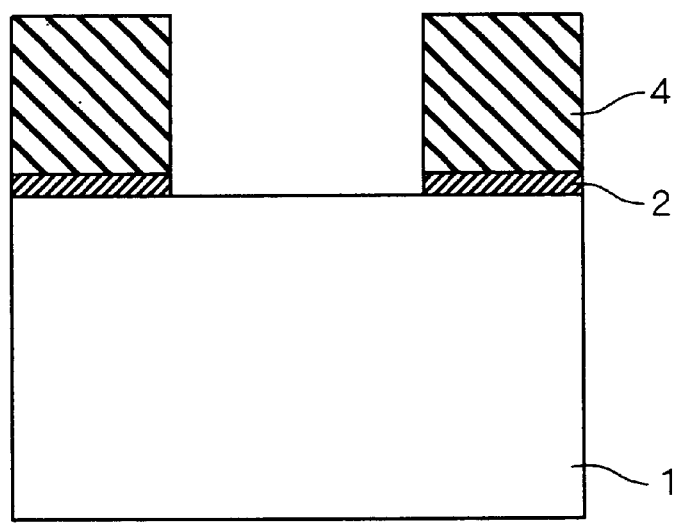
FIGS. 16 to 19 illustrate steps of manufacturing a semiconductor device according to a modification 1 of the embodiment 1.

A modification 1 of the embodiment 1 is now described. FIGS. 16 to 19 are step diagrams illustrating a manufacturing method according to this modification. In this manufacturing method, a silicon nitride film 4 is first formed on a silicon dioxide film 2 serving as an underlayer oxide film without forming a polysilicon film 3 in a step similar to that shown in FIG. 2. The silicon dioxide film 2 is formed in a thickness of about 10 nm to 20 nm, and the silicon nitride film 4 is formed in a thickness of about 100 nm to 250 nm. Thereafter steps similar to those shown in FIGS. 3 and 4 are carried out with no polysilicon film 3. Consequently, a structure shown in FIG. 16 is obtained.

Figure 17:
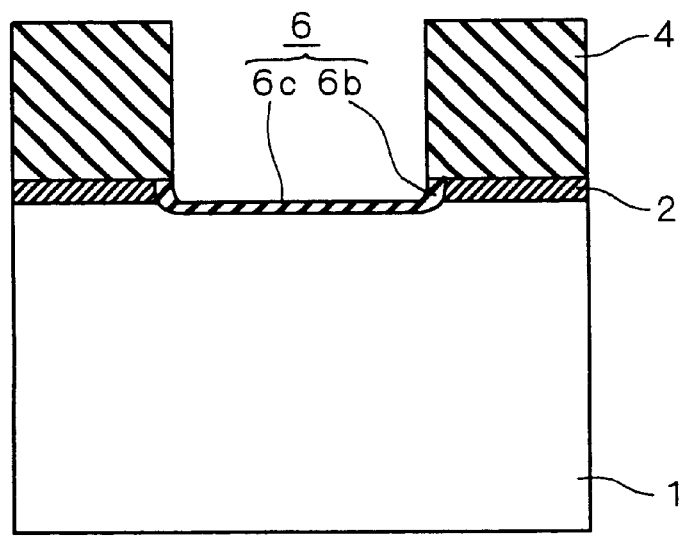
Figure 18:
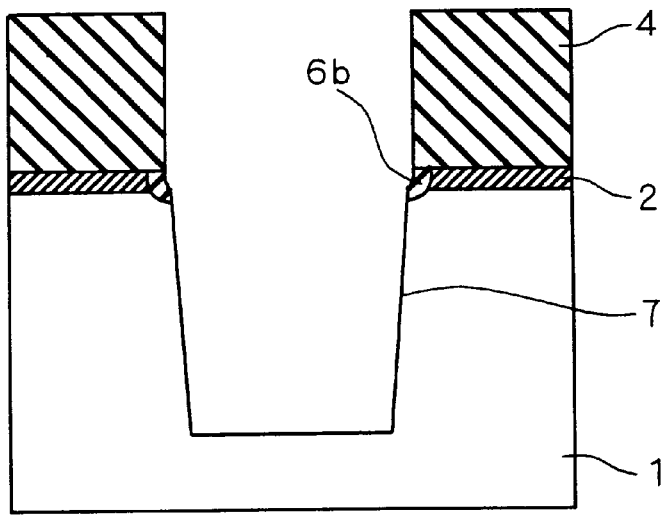
Figure 19:
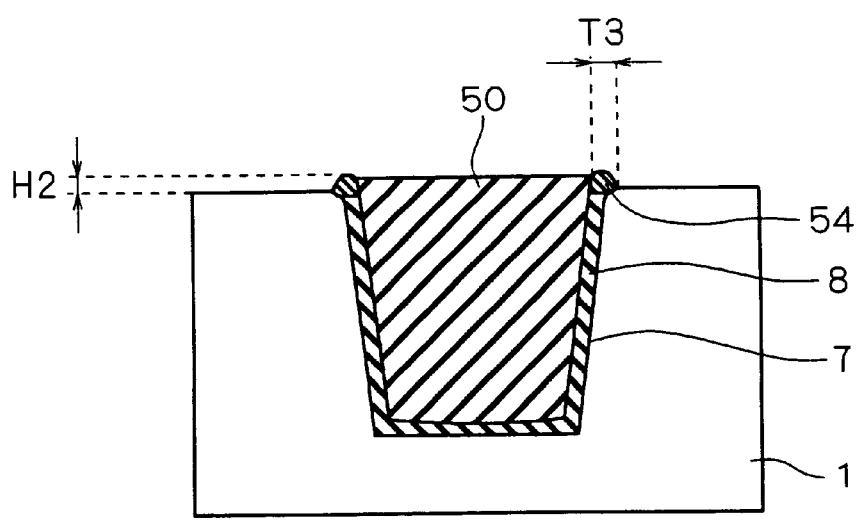

Then, oxynitridation is performed in an $NO/O_2$ mixed atmosphere, for example, thereby forming a silicon oxynitride film 6 on an exposed surface of a silicon substrate 1 and the side wall of the silicon dioxide film 2, as shown in FIG. 17. The silicon oxynitride film 6 may be formed while changing the gas atmosphere from an NO atmosphere to an $O_2$ atmosphere, or vice versa.

Then, the silicon substrate 1 is selectively removed to a depth of about 100 nm to 300 nm by reactive ion etching, thereby forming a trench 7 as shown in FIG. 17. Thereafter steps similar to those shown in FIGS. 7 to 11 are carried out, thereby obtaining a structure shown in FIG. 19. Thereafter a step similar to that shown in FIG. 12 is carried out.

Principal difference between the embodiment 1 and the modification 1 resides in whether or not the polysilicon film 3 is formed. The polysilicon film 3 is adapted to relax stress by forming the bird's beak 51. Therefore, the bird's beak length T2 (FIG. 11) of the bird's beak 51 formed by the method according to the embodiment 1 is larger than the bird's beak length T3 of a bird's beak 54 (FIG. 19) formed in the method according to the modification 1. Consequently, the method according to the embodiment 1 is superior to the method according to the modification 1 in relation to the effect of relaxing stress.

The bird's beak 51 formed also on the side wall of the polysilicon film 3 has a large height H1 (FIG. 11) in the method according to the embodiment 1, while the height H2 (FIG. 19) of the bird's beak 54 obtained in the method of the modification 1 forming no polysilicon film 3 is smaller than the height H1 substantially by the thickness of the polysilicon film 3. When the semiconductor device comprises a memory cell array, for example, and a gate electrode wire serving as a word line is formed by patterning, a mask pattern is simultaneously transferred to both of the STI structure and the silicon substrate 1. When a large step is provided between the STI structure and the silicon substrate 1 due to the large height H1 of the bird's beak 51, a large defocus margin is required in the transfer step. The method according to the modification 1 has a low step and hence requires no large defocus margin.

4. Modification 2 of Embodiment 1

Figure 20:
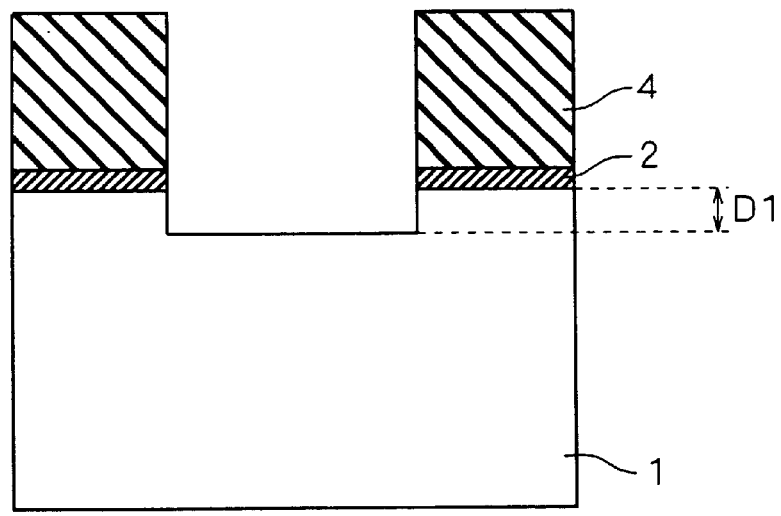
FIGS. 20 to 23 illustrate steps of manufacturing a semiconductor device according to a modification 2 of the embodiment 1.

Another modification of the embodiment 1 is now described. FIGS. 20 to 23 are step diagrams illustrating a manufacturing method according to the modification 2. In this manufacturing method, a silicon nitride film 4 is first formed on a silicon dioxide film 2 serving as an underlayer oxide film without forming a polysilicon film 3 in a step similar to that shown in FIG. 2, similarly to the modification 1. The silicon dioxide film 2 is formed in a thickness of about 10 nm to 20 nm, and the silicon nitride film 4 is formed in a thickness of about 100 nm to 250 nm. Thereafter steps similar to those shown in FIGS. 3 and 4 are carried out with no polysilicon film 3. In the step similar to that shown in FIG. 4, the main surface of a silicon substrate 1 is also selectively removed by etching. Consequently, a structure shown in FIG. 20 is obtained. The depth D1 of the removed part of the silicon substrate 1 is set in the range of about 10 nm to 100 nm.

Figure 21:
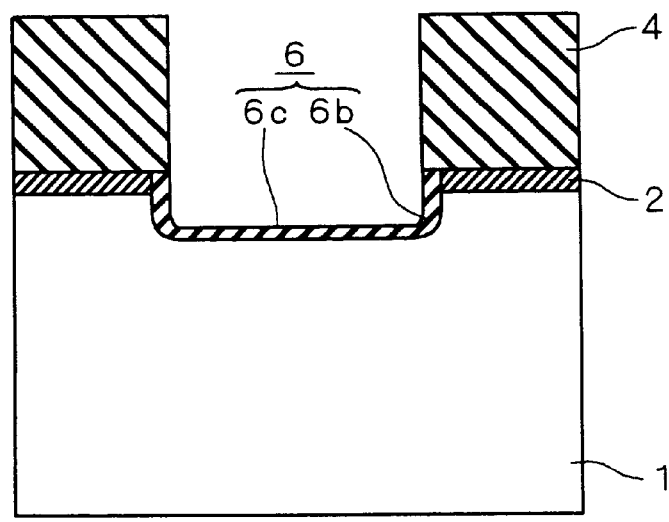

Then, oxynitridation is performed in an $NO/O_2$ mixed atmosphere, for example, thereby forming a silicon oxynitride film 6 on the exposed surface of the silicon substrate 1 and the side wall of the silicon dioxide film 2, as shown in FIG. 21. The silicon oxynitride film 6 may be formed while changing the gas atmosphere from an NO atmosphere to an $O_2$ atmosphere, or vice versa.

Figure 22:
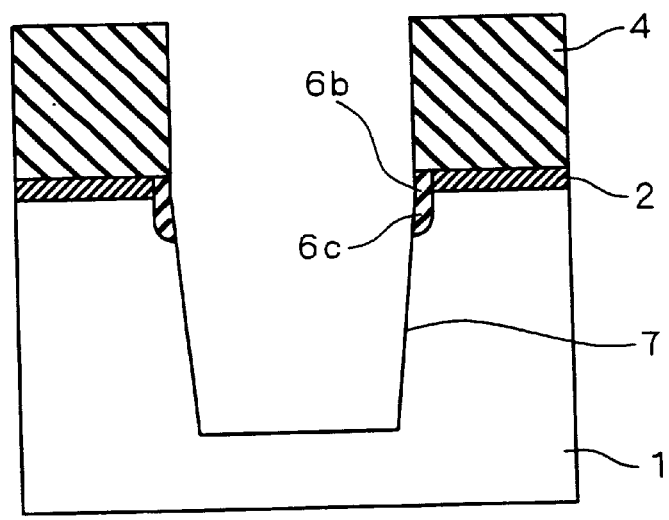

Then, the silicon substrate 1 is selectively removed to a depth of about 100 nm to 300 nm by reactive ion etching, thereby forming a trench 7 as shown in FIG. 22. Thereafter steps similar to those shown in FIGS. 7 to 11 are carried out, thereby obtaining a structure shown in FIG. 23. Thereafter a step similar to that shown in FIG. 12 is carried out.

Figure 23:
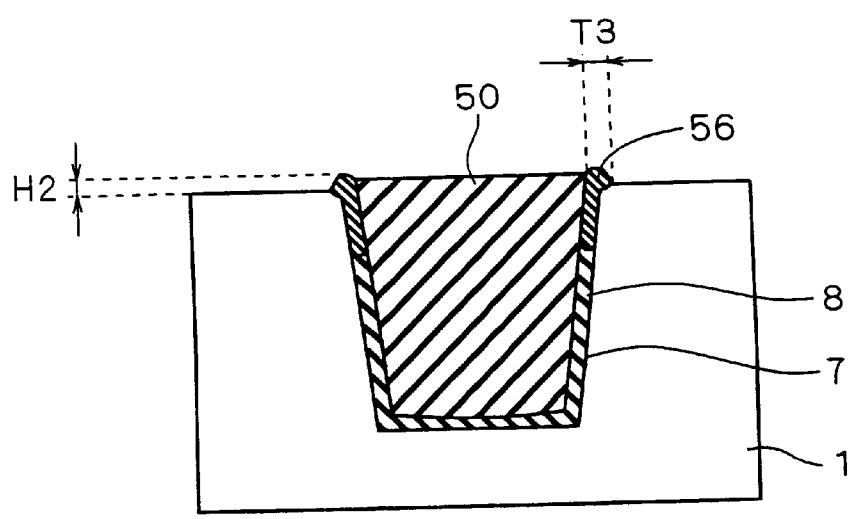

According to the method of the modification 2, a portion of an inner wall insulator film 8 containing silicon oxynitride extends up to a portion under a bird's beak 56 deeper than the main surface of the silicon substrate 1, as shown in FIG. 23. While boron is absorbed in an STI structure and segregates in heat treatment for activating channel-implanted boron, the amount of the segregating boron is reduced when the portion containing silicon oxynitride extends up to a deep part of the silicon substrate 1, i.e., when a silicon oxynitride film is present on the side wall of the STI structure.

Therefore, an inverse channel effect resulting from that the concentration of boron is reduced due to segregation on the STI structure on a gate end along the gate width GW (FIG. 1) is smaller in the method according to the modification 2 obtaining the structure of FIG. 23 as compared with the method according to the embodiment 1 or the modification 1. It can be said that the method of the modification 2 having small fluctuation of a threshold voltage with respect to dispersion of finishing of the gate width GW is advantageous as compared with the embodiment 1 and the modification 1 for improving the yield in mass production.

5. Embodiment 2

The feature of a semiconductor device and a method of manufacturing the same according to an embodiment 2 of the present invention resides in that an underlayer insulator film formed on the main surface of a semiconductor substrate in a step of forming a trench for an STI structure on the main surface of the semiconductor substrate is formed by a multilayer film of silicon dioxide film (underlayer oxide film)/silicon oxynitride film or silicon dioxide film (underlayer oxide film)/silicon oxynitride film/silicon oxyfluoride film (SiOF). The etching rate for the silicon oxynitride film is small with respect to an etchant acting on the silicon dioxide film, whereby formation of the depressed part 110 (FIG. 56) can be suppressed in the STI structure. This characteristic manufacturing method is now described with reference to manufacturing step diagrams of FIGS. 24 to 31.

Figure 24:
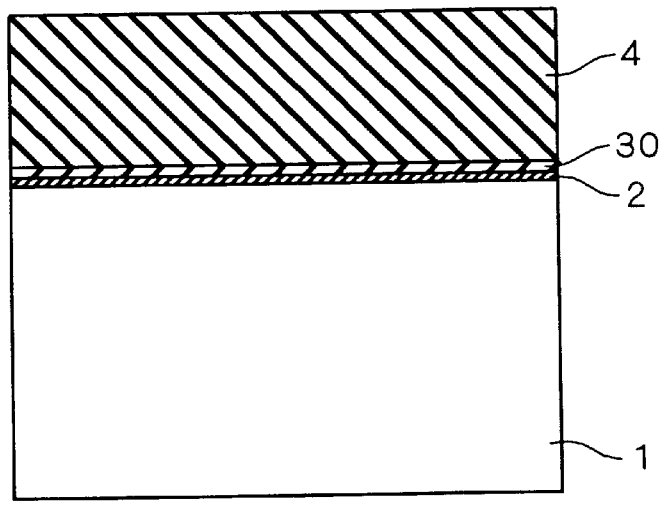
FIGS. 24 to 31 illustrate steps of manufacturing a semiconductor device according to an embodiment 2 of the present invention.

According to this manufacturing method, the step shown in FIG. 24 is first carried out. In the step shown in FIG. 24, a silicon substrate 1 having a main surface is first prepared. Thereafter the silicon substrate 1 is thermally oxidized thereby forming a silicon dioxide film 2 on the main surface in a thickness of about 2 nm to 5 nm. Then, a silicon oxynitride film 30 of about 10 nm in thickness is formed on the silicon dioxide film 2 and thereafter a silicon nitride film 4 of about 100 nm to 250 nm in thickness is further formed.

Figure 25:
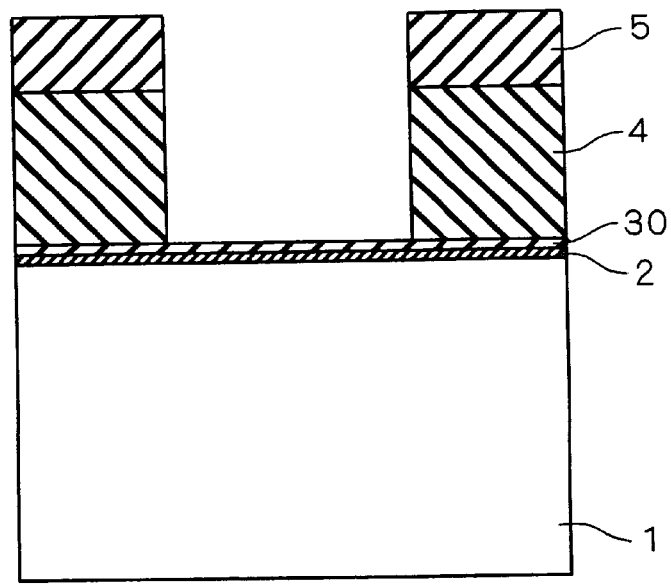

Then, the step shown in FIG. 25 is carried out. In the step shown in FIG. 25, resist is first applied onto the silicon nitride film 4 and thereafter patterned through a transfer step, thereby forming a resist mask 5. Thereafter anisotropic etching is executed through the resist mask 5 serving as a mask (screen), thereby selectively removing the silicon nitride film 4.

Figure 26:
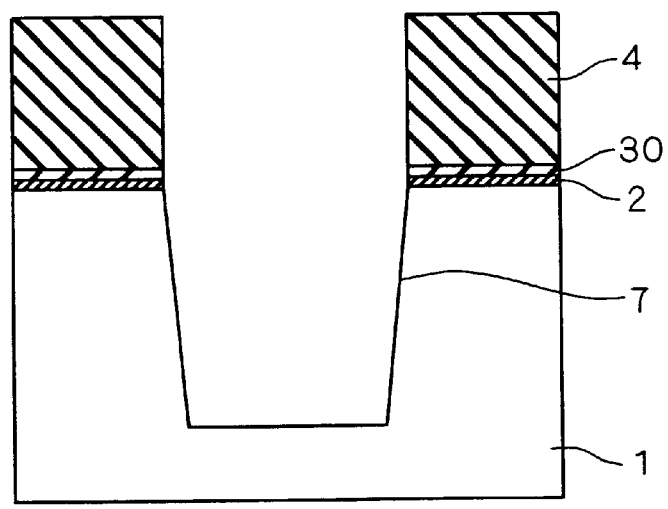

In the subsequent step shown in FIG. 26, the resist mask 5 is removed and thereafter reactive ion etching is executed through the patterned silicon nitride film 4 serving as a hard mask, thereby selectively removing the silicon oxynitride film 30, the silicon dioxide film 2 and the silicon substrate 1. Consequently, a trench 7 is formed in the silicon substrate 1. Etchants employed for the anisotropic etching are properly changed following stepwise change of the films to be removed in this step.

Figure 27:
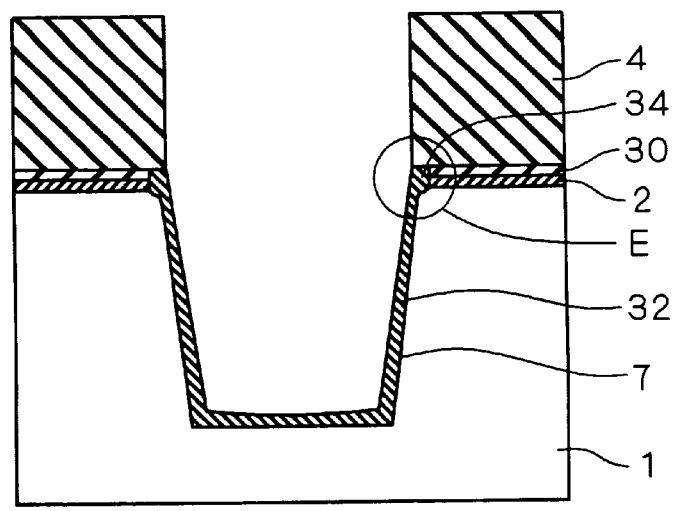

Then, the inner wall of the trench 7 is oxidized in an HCl atmosphere or a dry $O_2$ atmosphere, for example, thereby forming an oxide film serving as an inner wall insulator film 32, as shown in FIG. 27. At this time, a bird's beak 34 is formed on the upper end (opening end) E of the trench 7. The diffusion coefficient of an oxidant in the silicon oxynitride film 30 is smaller than that in the silicon dioxide film 2. Therefore, the bird's beak length is reduced as compared with the case of employing a silicon dioxide film in place of the silicon oxynitride film 30, whereby reduction of an active region can be suppressed.

When employing a silicon dioxide film in place of the silicon oxynitride film 30, the area of the active region is reduced although an effect of relaxing stress on the upper end of the STI structure is large due to the large bird's beak length. When employing a silicon nitride film in place of the silicon oxynitride film 30, the bird's beak length is further reduced as compared with the case of employing the silicon oxynitride film 30, and hence the effect of relaxing stress is insufficient since the upper end of the STI structure cannot be rounded although the effect of suppressing reduction of the area of the active region is higher.

Therefore, the role of the silicon oxynitride film 30 is to compatibly implement both effects of reducing the bird's beak length for somewhat widely ensuring the active region and relaxing concentration of stress on the upper end of the STI structure. The balance between these effects can be optimized by adjusting the thickness of the silicon oxynitride film 30 and the nitride concentration in the silicon oxynitride film 30.

Figure 28:
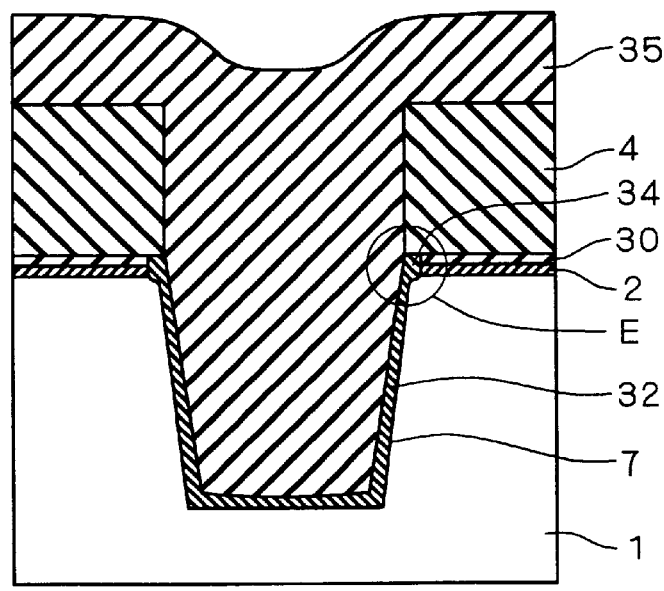

Then, silicon dioxide ($SiO_2$), for example, is deposited as a filled insulation 35, thereby filling the trench 7 as shown in FIG. 28. The filled insulation 35 may alternatively be prepared from silicon oxynitride, TEOS or SiOF, in place of silicon dioxide.

Figure 29:
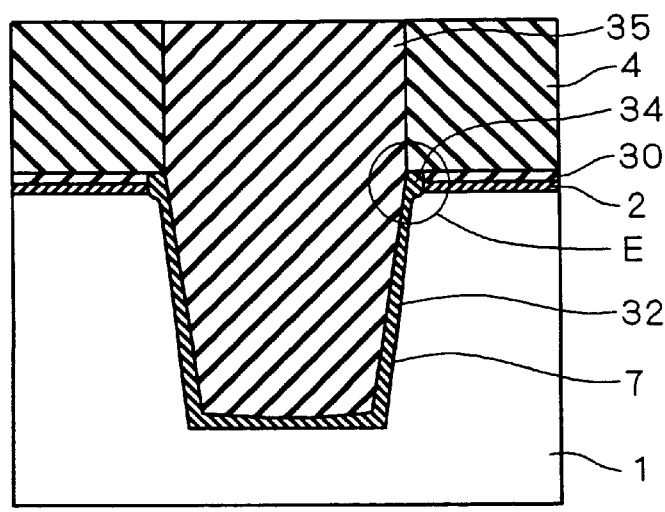
Figure 30:
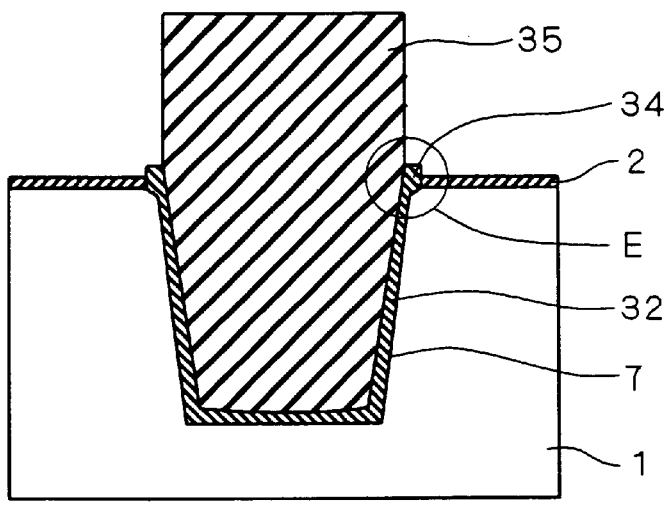

Then, CMP is performed through the silicon nitride film 4 serving as a stopper, thereby flattening the upper surface of the filled insulation 35, as shown in FIG. 29. Then, the silicon nitride film 4 and the silicon oxynitride film 30 are removed by etching, as shown in FIG. 30.

Figure 31:
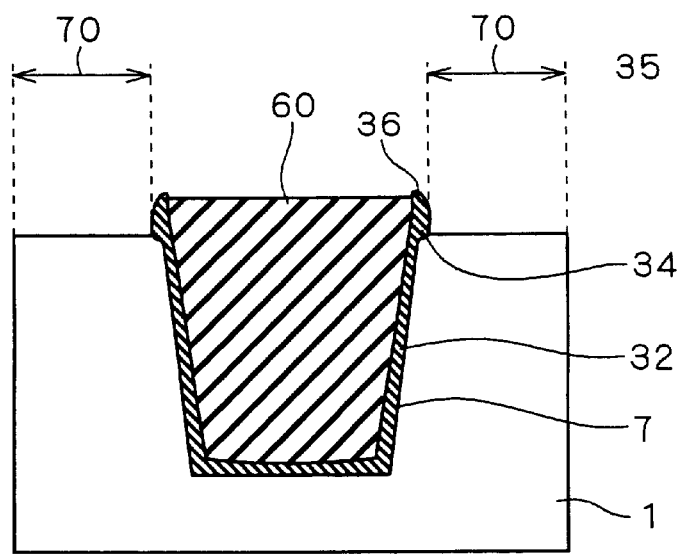

Then, etching is executed through hydrofluoric acid, thereby removing part of the filled insulation 35 and the silicon dioxide film 2, as shown in FIG. 31. Thus, a filled insulation 60 is formed from the filled insulation 35. At this time, the bird's beak 34 is partially removed by etching. The bird's beak 34 includes a region 36 formed to involve part of the silicon oxynitride film 30 and hence this region 36 stops the etching. Therefore, no depressed part 110 (FIG. 56) is formed on the upper end of the STI structure. This is because the etching rate for silicon oxynitride (SiON) is smaller than that for silicon dioxide ($SiO_2$) with respect to HF.

Thereafter a step similar to that of FIG. 12, for example, is carried out thereby forming a semiconductor element. While the underlayer insulator film has the two-layer structure of $SiON/SiO_2$ in the above description, a three-layer structure of SiOF (silicon oxyfluoride)/$SiON/SiO_2$ may alternatively be employed. In this case, nitrogen and fluorine reach the $SiO_2/Si$ interface in inner wall oxidation thereby attaining an effect of reducing the interface state density. Further, the silicon oxyfluoride film is widely replaceable with a silicon oxyhalide film.

6. Modification 1 of Embodiment 2

Figure 32:
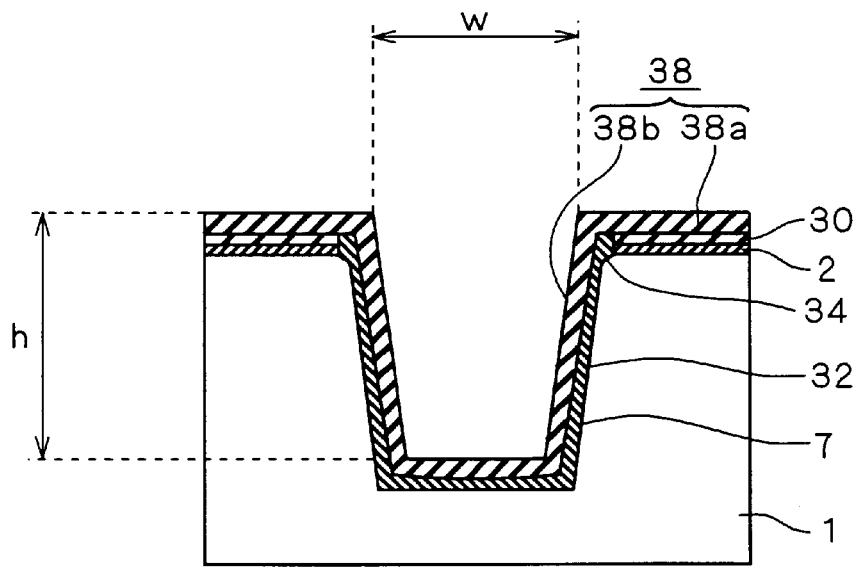
FIGS. 32 to 37 illustrate steps of manufacturing a semiconductor device according to a modification 1 of the embodiment 2.

A modification 1 of the embodiment 2 is now described. FIGS. 32 to 37 are step diagrams for illustrating a manufacturing method according to this modification. In this manufacturing method, steps similar to those shown in FIGS. 24 to 27 are carried out and thereafter the step shown in FIG. 32 is carried out. In the step shown in FIG. 32, etching is executed with hot phosphoric acid thereby removing a silicon nitride film 4, and thereafter a silicon nitride film 38 is deposited in a thickness of about 10 nm to 20 nm.

The silicon nitride film 4 serving as a hard mask is removed so that no clearance (seam) is defined by simplifying charging when charging the trench 7 with silicon dioxide in a later step. When defining the aspect ratio of the trench 7 as h/w with the depth h and the width w shown in FIG. 32, the depth h is reduced by the thickness of the silicon nitride film 4 to reduce the aspect ratio when the silicon nitride film 4 is removed, whereby the trench 7 is readily charged with silicon dioxide. The effect attained by removing the silicon nitride film 4 is increased as the element isolation width (width of the STI structure) is reduced.

In the silicon nitride film 38, a silicon nitride film 38a formed on a silicon oxynitride film 30 functions as a stopper in a later CMP step. On the other hand, a silicon nitride film 38b formed along an inner wall insulator film 32 functions to prevent occurrence of oxidation-induced defects resulting from oxidation of the side wall or the bottom surface of the STI structure in an oxidation step after formation of the STI structure. In other words, the silicon nitride film 38b serves as an anti-oxidation film.

Figure 33:
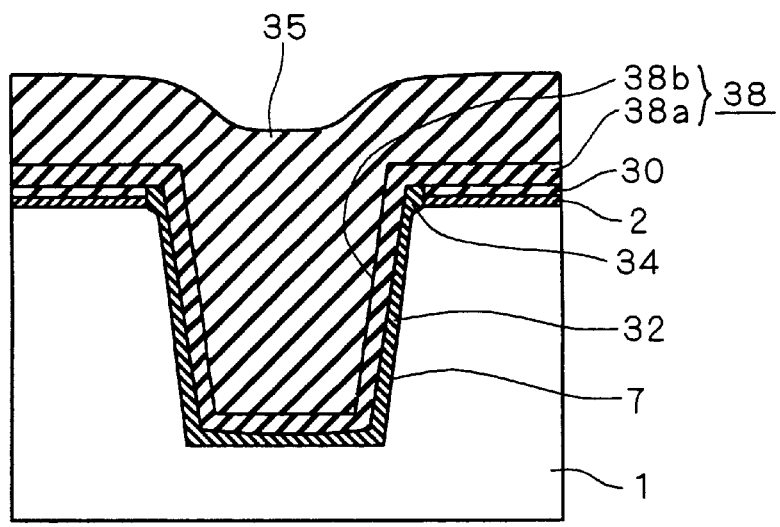

Then, the trench 7 is charged by depositing silicon dioxide, for example, as a filled insulation 35, as shown in FIG. 33. The filled insulation 35 may be prepared from any insulation such as $SiO_2$, SiON, TEOS or SiOF. When attaching importance to increase in the operating speed of the circuit by reducing parasitic capacitance, SiOF (silicon oxyfluoride) having a low dielectric constant is optimum.

Fluorosilicate glass (FSG), hydrogen silsesquioxane (HSQ), fluorinated polysilicon, polyphenylquinoxaline polymer, fluoropolyimide, amorphous fluorocarbon (a-C:F), methylpolysiloxane (MPS), polyarylene ether (PAE) or the like is known as the material for an insulator film in addition to SiOF, and the relative dielectric constant thereof is about 2.9 to 3.5. This material may be selected for the filled insulation 11.

Figure 34:
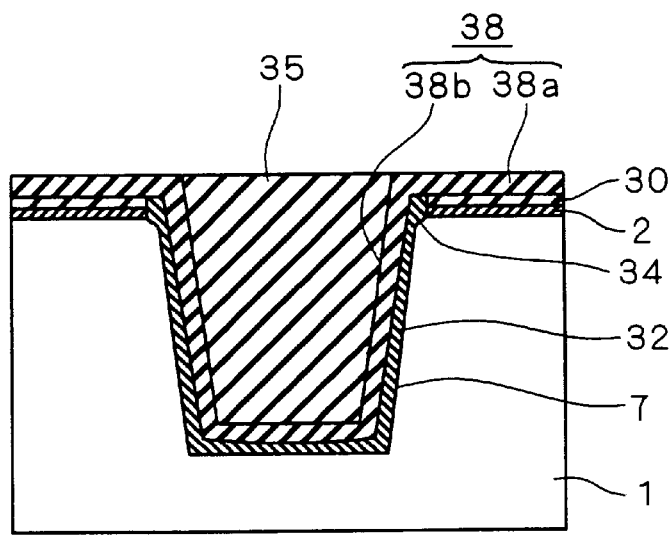

Then, CMP is performed through the silicon nitride film 38a serving as a stopper thereby flattening the upper surface of the filled insulation 35, as shown in FIG. 34. In the subsequent step shown in FIG. 35, the silicon nitride film 38a is removed by executing etching with hot phosphoric acid, and thereafter the silicon oxynitride film 30 is removed by etching. While the silicon oxynitride film 30 is also partially removed when the silicon nitride film 38a is removed by etching, the etching rate for silicon oxynitride is so small with respect to hot phosphoric acid serving as an etchant for silicon nitride that the silicon oxynitride film 30 is not so removed as to form a depression part 110 (FIG. 56) on the upper end of the STI structure.

In order to effectively suppress formation of the depressed part 110, the thickness of the silicon nitride film 38b may be reduced for limiting the amount of reaching of the hot phosphoric acid. In this sense, the thickness of the silicon nitride film 38b is desirably set to about 3 nm to 7 nm. If the thickness of the silicon nitride film 38b is excessively reduced, an oxidant for a gate oxide film, for example, disadvantageously reaches the interface between the STI structure and the silicon substrate 1 to cause oxidation-induced defects. Therefore, the thickness of the silicon nitride film 38b has a lower limit. It is possible to suppress diffusion of the oxidant when the thickness is about 3 nm at the minimum. Thereafter heat treatment is performed in an argon atmosphere at a temperature of about 1100° C., for example, in order to densify the filled insulation 35.

Figure 36:
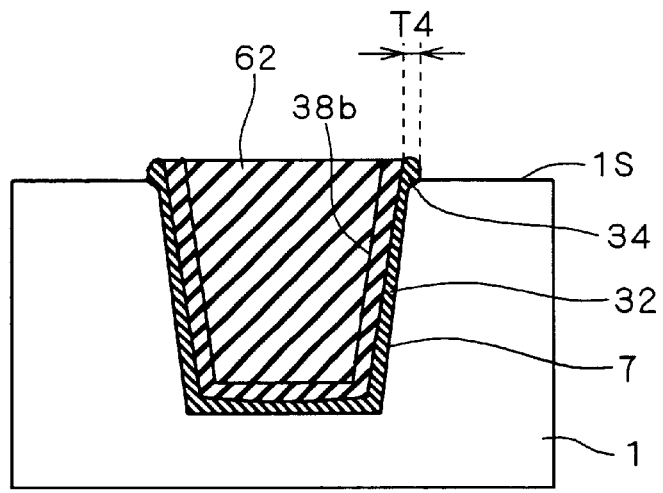

Then, the step shown in FIG. 36 is carried out. In the step shown in FIG. 36, part of silicon dioxide forming the filled insulation 35 and the silicon dioxide film 2 are removed by etching through hydrofluoric acid, for example. Thus, a filled insulation 62 is formed from the filled insulation 35. At this time, the bird's beak 34 is partially removed by etching.

The bird's beak 34 includes a part 36 formed to involve the silicon oxynitride film 30, and this part 36 consists of silicon oxynitride (SiON). The etching rate for SiON is lower than that for $SiO_2$, and hence this part 36 stops etching. Therefore, no depressed part 110 (FIG. 56) is formed on the upper end of the STI structure. While the bird's beak length T4 showing the thickness of the bird's beak 34 does not largely extend to an active region since the silicon oxynitride film 30 suppresses oxidation in a step of inner wall oxidation, the shape of the upper end of the STI structure can be rounded by the bird's beak 34 since the silicon substrate 1 is oxidized under its main surface 1s so that stress can be relaxed as a result.

The superiority of the semiconductor device and the method of manufacturing the same according to the modification 1 over the prior art disclosed in the aforementioned literature is now described.

Literature 2 discloses a technique of removing an $SiO_2$ film formed on the side wall of a groove (numeral 2 in FIG. 3) and newly forming another $SiO_2$ film (numeral 3 in FIG. 3) for removing process damage in a section "0026". The $SiO_2$ film (3) is formed only on the side wall of the groove (2). While the technique of literature 2 is seemingly equivalent to the modification 1 in the point of removing the film by etching and thereafter newly forming the same type of film, the $SiO_2$ film has neither action of the silicon nitride film 38 serving as the anti-oxidation film nor action of a stopper in a CMP step.

Literature 3 discloses a step of forming a trench in a silicon substrate, thereafter oxidizing an inner wall and further forming a silicon nitride film on an inner wall oxide film among steps of forming an STI structure in FIG. 1. However, the modification 1 is different from the technique of literature 3 in the point that the silicon nitride film is formed on the inner wall oxide film after forming the bird's beak on the upper end of the STI structure for relaxing stress. In literature 3, no bird's beak is formed on the upper end of an STI structure and hence there is a possibility that stress concentrates on this portion to cause defects. Thus, a leakage current is increased. In the technique of the modification 1, stress is relaxed on the upper end of the STI structure due to the presence of the bird's beak 34, and a leakage current is reduced as a result. The effect of stress relaxation with the bird's beak 34 becomes remarkable as the width (pitch) of the STI structure or the active region is reduced.

Literature 4 discloses an element isolation structure formed by forming an oxide film on the inner wall of a trench for element isolation and thereafter charging the trench with SiOF in FIG. 1. The example employing SiOF as the filled insulation 35 in the modification 1 is different from the technique of literature 4 mainly in presence/absence of the silicon nitride film 38. In the structure of literature 4 having no silicon nitride film 38, an oxidant reaches an STI structure/silicon substrate interface through a filled insulation of the STI structure to cause oxidative reaction when a gate oxidation temperature (temperature of heat treatment for forming a gate oxide film) is high and the time for this heat treatment is long, to result in oxidation-induced stress. If the pitch is reduced following refinement of a semiconductor element, dislocations are caused in an active region to result in increase of a leakage current.

In order to prevent occurrence of oxidation-induced stress around the STI structure in the silicon substrate, a film preventing diffusion of an oxidant may be formed in the trench. The silicon nitride film 38 shown in FIG. 33 in relation to the modification 1 has action of suppressing diffusion of an oxidant so that the STI structure/silicon substrate interface is not oxidized in gate oxidation, to result in no oxidation-induced defects. Therefore, no dislocations are caused in the active region around the STI structure also when the pitch is reduced.

Literature 5 discloses a structure of forming a silicon nitride film along the inner wall of a trench. However, the modification 1 is not a mere combination of the technique of literature 4 and the technique of literature 5, as described below in detail.

Figure 37:
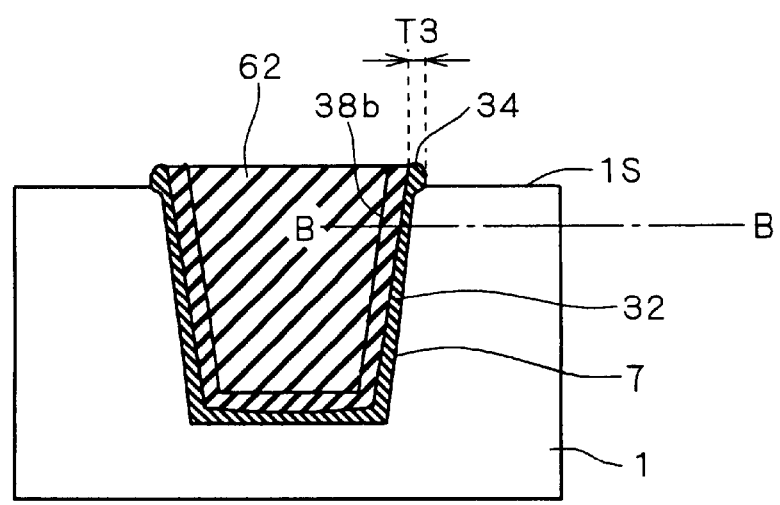
Figure 38:
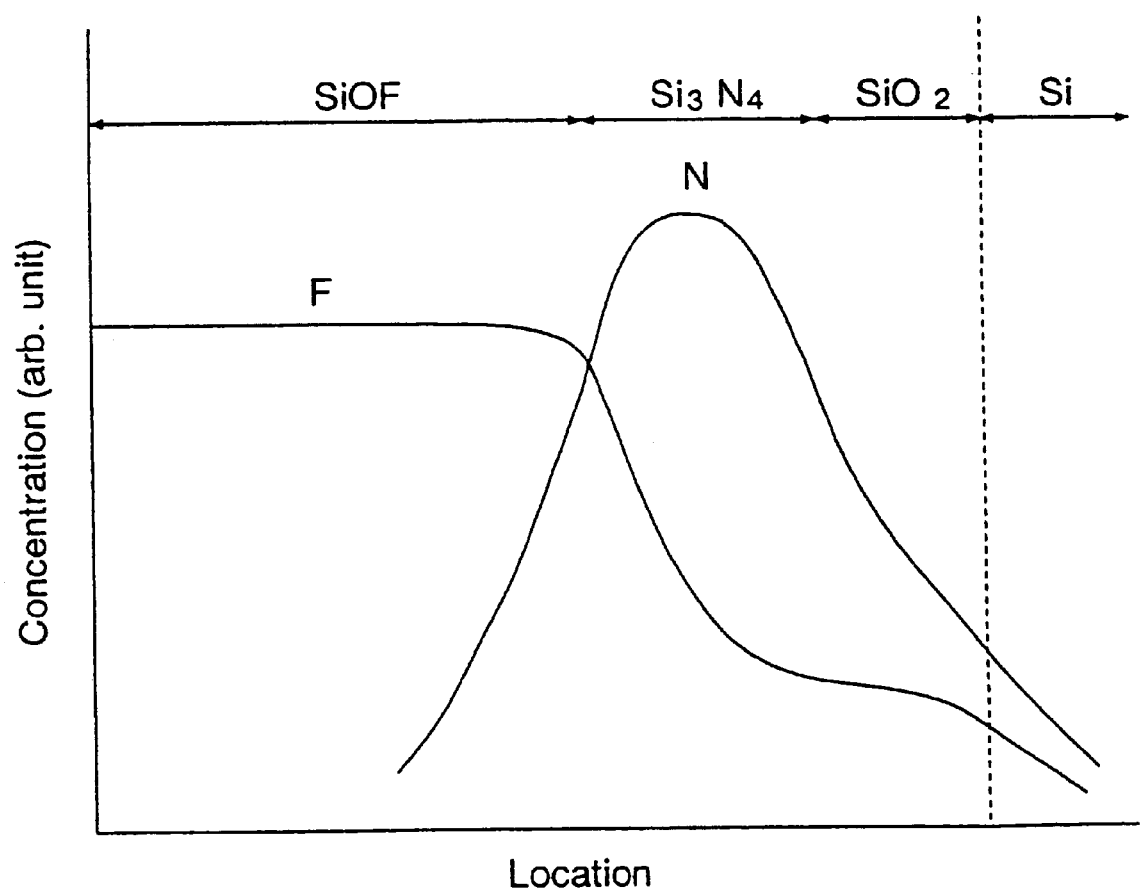
FIGS. 38 and 39 are explanatory diagrams of the semiconductor device according to the modification 1 of the embodiment 2.

FIG. 37 is a manufacturing step diagram showing the STI structure in which the trench 7 is charged with the filled insulation 35 (FIG. 33) of SiOF, thereafter the filled insulation 62 is formed and a thermal shrinking step is carried out. FIG. 38 is a graph typically showing concentration distribution of fluorine (F) and nitrogen (N) along the line B—B in FIG. 37 after the thermal shrinking step. Fluorine contained in SiOF forming the filled insulation 62 and nitrogen contained in the silicon nitride film 38 diffuse due to thermal diffusion in thermal shrinking, and hence each concentration distribution is gentle (gradual). Consequently, the concentration is considerably increased both in the inner wall insulator film 32 and the silicon substrate 1. Fluorine or nitrogen terminates dangling bonds when reaching an $SiO_2$/Si interface, and hence the interface state density is reduced. The interface states are present on not only the side surface of the STI structure shown in FIG. 38 but also on the bottom surface.

Figure 39:
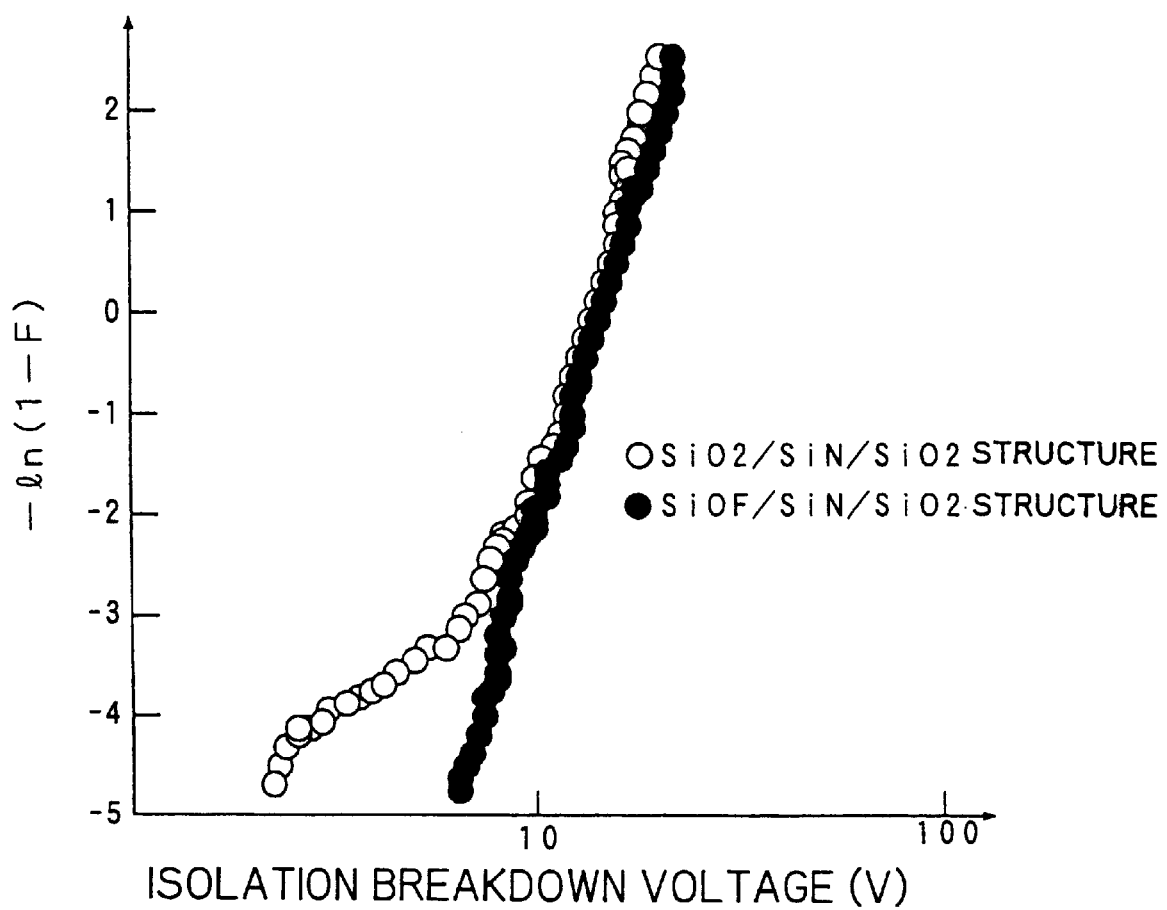

When the interface state density is reduced, a TAT (trap assisted tunnel) current is reduced to reduce a leakage current. While an avalanche phenomenon resulting from impact-ionization caused by the TAT current problematically reduces an isolation breakdown voltage, the isolation breakdown voltage is improved when the interface state density is reduced. The isolation breakdown voltage is improved also when only nitrogen is added. When plotting the isolation breakdown voltage on the horizontal axis while plotting the accumulated error ratio on the horizontal axis (well-known "Weibull plotting") as shown in a graph of FIG. 39, however, isolated samples having low breakdown voltages are observed when only nitrogen is added, i.e., the filled insulation is prepared from $SiO_2$ or SiON. When nitrogen and fluorine are added, i.e., when the filled insulation is prepared from SiOF, no isolation samples having low breakdown voltages are observed. In consideration of the yield in mass production, therefore, it is advantageous to add nitrogen and fluorine in order to adjust the isolation breakdown voltage. The same effect is attained also as to a leakage current. When employing SiOF for the filled insulation 35 on the silicon nitride film 38, an STI structure having a low dielectric constant is attained and no oxidation-induced defects are caused in gate oxidation as pointed out in general, while dispersion of the isolation breakdown voltage as well as dispersion of distribution of the leakage current are reduced in addition.

Effects similar to those of the modification 1 can be attained also when forming a silicon oxynitride film in place of the silicon nitride ($Si_3N_4$) film 38.

7. Modification 2 of Embodiment 2

Figure 40:
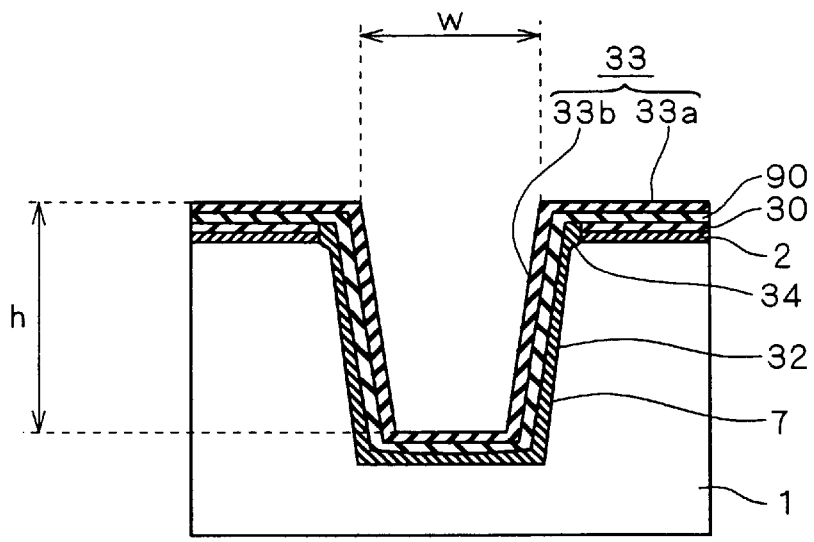
FIG. 40 illustrates a step of manufacturing a semiconductor device according to a modification 2 of the embodiment 2.

As a modification 2 of the embodiment 2, a silicon oxynitride film 90 and a silicon nitride film 33 may be deposited in thicknesses of about 3 to 10 nm and about 3 to 7 nm respectively after removing a silicon nitride film 4 serving as a hard mask by etching in place of the step shown in FIG. 32, as shown in a step diagram of FIG. 40. Subsequent steps are similar to those shown in FIGS. 33 to 36. Also in this case, an STI structure having no depressed part 110 (FIG. 56) can be formed.

Figure 35:
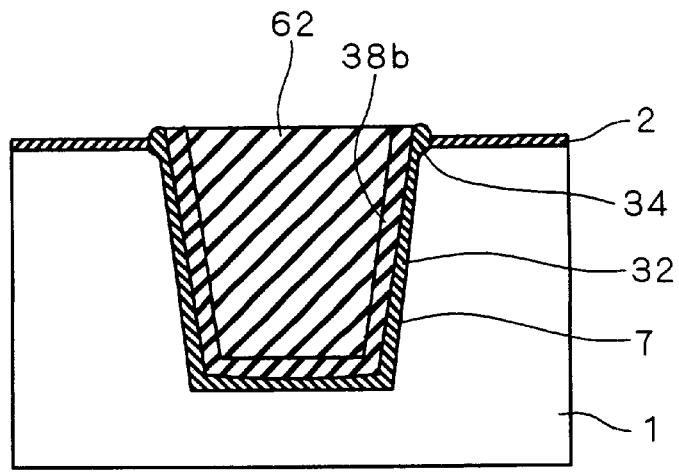

In order to prevent removal of a silicon nitride film 33b due to action of etching caused by hot phosphoric acid when a silicon nitride film 33a is removed by etching through the hot phosphoric acid in the subsequent step similar to that shown in FIG. 35, the thickness of the silicon nitride film 33 must be set below about 7 nm. When gate oxidation is performed at a relatively high temperature for a long time, however, the thickness of the silicon nitride film 33b may be insufficient if the same is not more than 7 nm.

An effect of suppressing an oxidant can be reinforced by depositing the silicon oxynitride film 90. The silicon oxynitride film 90 is not removed by action of etching caused by infiltration of hot phosphoric acid. Thus, the modification 2 has such an advantage that oxidation-induced defects are hardly caused due to suppression of diffusion of the oxidant as compared with the modification 1.

8. Modification 3 of Embodiment 2

Figure 41:
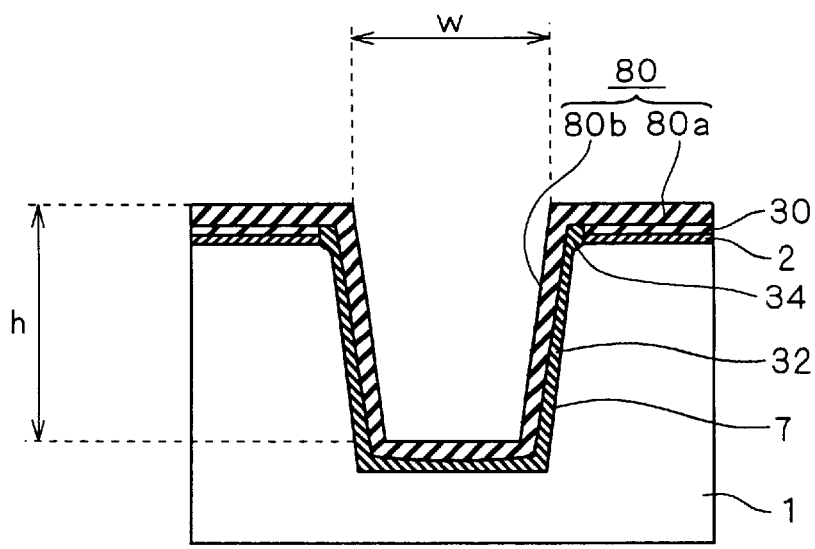
FIG. 41 illustrates a step of manufacturing a semiconductor device according to a modification 3 of the embodiment 2.

As a modification 3 of the embodiment 2, a silicon oxynitride film 80 may be deposited in a thickness of about 3 nm to 10 nm in place of the silicon nitride film 38 after removing a silicon nitride film 4 serving as a hard mask in place of the step shown in FIG. 32, as shown in a step diagram of FIG. 41. Subsequent steps are similar to those shown in FIGS. 33 to 36. Also in this case, an STI structure having no depressed part 110 (FIG. 56) can be formed. The coefficient of volume expansion of silicon oxynitride (SiON) is approximate to that of silicon, and hence stress is further effectively relaxed around the upper end of an STI structure as compared with the modification 1.

9. Embodiment 3

The feature of a method of manufacturing a semiconductor device according to an embodiment 3 of the present invention resides in that nitrogen, halogen or nitrogen halide is ion-implanted into a polysilicon film or a silicon nitride film in a multilayer film of silicon dioxide film/polysilicon film/silicon nitride film or silicon dioxide film/silicon nitride film serving as a hard mask for forming a bird's beak in a step of forming a trench for an STI structure in a semiconductor substrate.

Nitrogen or halogen implanted into the silicon nitride film or the polysilicon film forming the hard mask thermally diffuses in heat treatment (e.g., inner wall oxidation) to reach a portion around the bird's beak on the upper end of the STI structure or the interface between a silicon dioxide film 2 and a silicon substrate 1. Consequently, the interface state density is reduced in this region. The interface state density is reduced since nitrogen or halogen terminates unsaturated bonds (dangling bonds) of silicon atoms present around the interface. Reduction of the interface state density leads to effects such as reduction of dispersion of the threshold voltage of a MOSFET and improvement of hot carrier resistance.

The ion implantation of nitrogen or the like characterizing the embodiment 3 can be executed in combination with the embodiment 1 or 2 (including any modification) or in the conventional manufacturing method. Further, the ion implantation of nitrogen or the like can be executed in various steps as illustrated in FIGS. 42 to 45.

Figure 42:
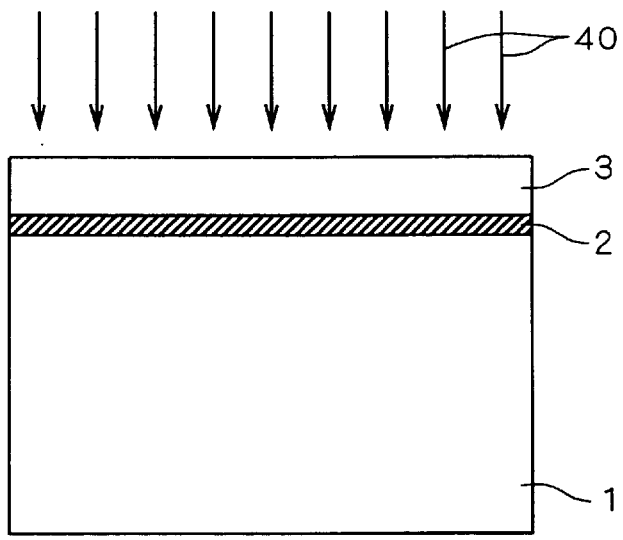
FIGS. 42 to 45 illustrate steps of manufacturing a semiconductor device according to an embodiment 3 of the present invention.

In the example shown in FIG. 42, a silicon dioxide film 2 and a polysilicon film 3 serving as the materials for a hard mask for forming a trench are formed on a silicon substrate 1 and thereafter ions 40 of nitrogen, halogen (e.g., fluorine) or nitrogen halide (e.g., nitrogen fluoride ($NF_3$)) are implanted into the overall upper surface of the polysilicon film 3. For example, nitrogen and fluorine may be simultaneously implanted. The ion implantation is performed at energy of about 10 keV to 50 keV and an dose rate in the range of about $1 \times 10^{14}/cm^2$ to $5 \times 10^{15}/cm^2$, for example. The element such as nitrogen introduced into the polysilicon film 3 diffuses by subsequent heat treatment (e.g., inner wall oxidation), thereby reducing the interface state density around a bird's beak on the upper end of the STI structure or the interface between the silicon dioxide film 2 and the silicon substrate 1.

Figure 43:
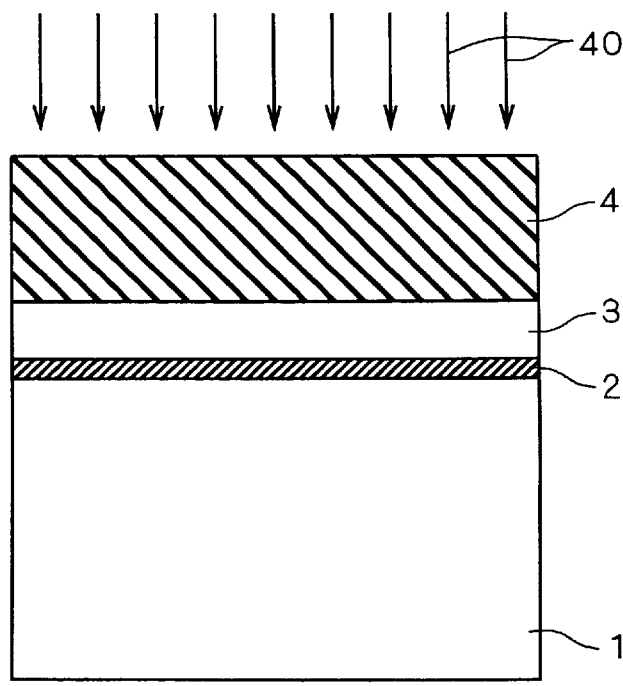

In the example shown in FIG. 43, a silicon nitride film 4 is formed on a polysilicon film 3 and thereafter ions 40 of nitrogen or the like are implanted. At this time, the ions 40 are implanted to reach the polysilicon film 3 through the silicon nitride film 4.

Figure 44:
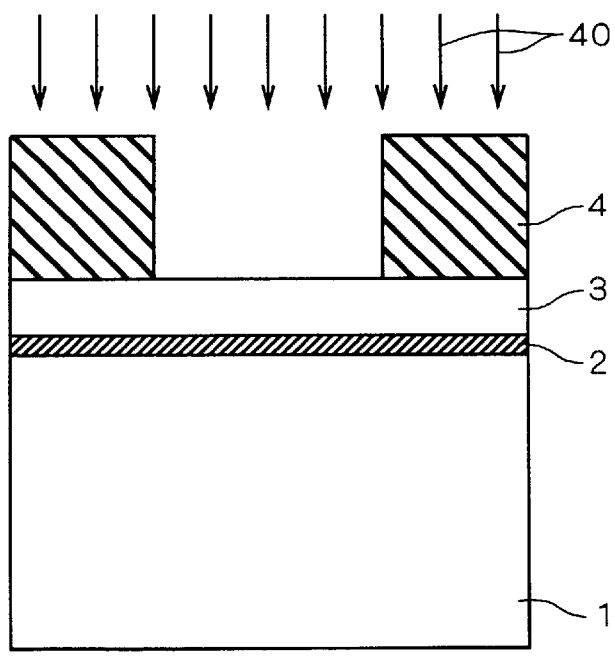

In the example shown in FIG. 44, a silicon nitride film 4 is patterned as a hard mask and thereafter ions 40 of nitrogen or the like are selectively implanted into a polysilicon film 3.

Figure 45:
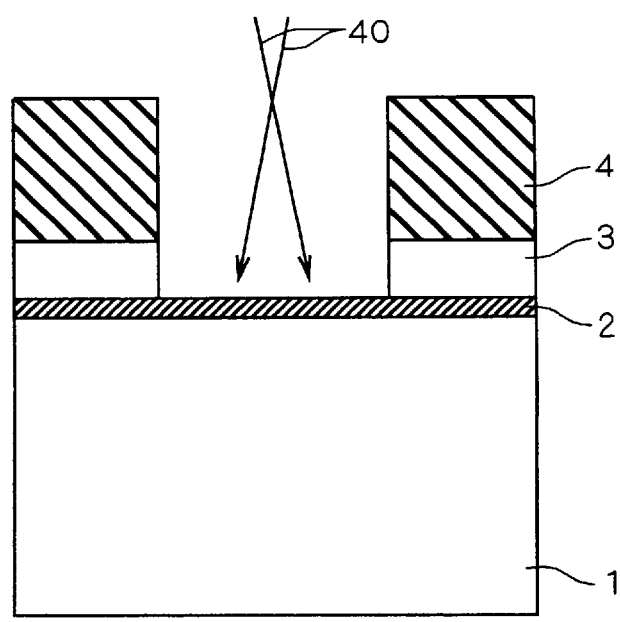

In the example shown in FIG. 45, a silicon nitride film 4 as well as a polysilicon film 3 are selectively removed by etching and thereafter ions 40 are implanted by oblique rotational implantation at an incident angle of 0° to 38°. The rotational implantation is performed through ion implantation with continuous rotation or single complete rotation divided into two, four or eight steps while changing the azimuthal angle stepwise, for example. The ions 40 of nitrogen or fluorine are effectively implanted into the side wall of the polysilicon film 3. In this step, the ions 40 are selectively implanted also into a silicon dioxide film 2 or the main surface of a silicon substrate 1 at the same time. In the mode shown in FIG. 45, the ions 40 are directly implanted into a portion where a bird's beak is formed, whereby the interface state density can be more effectively reduced.

While the hard mask is formed by a three-layer film consisting of the silicon dioxide film 2, the polysilicon film 3 and the silicon nitride film 4 in each of the examples shown in FIGS. 43 to 45, the manufacturing method according to this embodiment is also applicable to a hard mask formed by a two-layer film consisting of silicon dioxide film/silicon nitride film. In this case, the ions 40 of nitrogen or fluorine are implanted into the silicon nitride film. The element such as nitrogen implanted into the silicon nitride film thermally diffuses into the silicon dioxide film 2 in heat treatment, whereby an effect of reducing the interface state density can be similarly attained.

When the implanted ions 40 are prepared from nitrogen or nitrogen halide, the bird's beak length can be further suppressed.

Such a phenomenon is known that stress concentrates or nitridation is caused in annealing in a nitrogen atmosphere in an end (gate end) of a gate insulator film 13 along the gate width GW of a MOSFET, i.e., a portion where the gate insulator film 13 intersects with an STI structure, and hence the thickness of the gate insulator film 13 is reduced on the gate end along the gate width GW. When the thickness of the gate insulator film 13 is reduced in this portion, the threshold voltage is reduced or reliability of the gate insulator film 13 is reduced. It is known that accelerated oxidation is caused when implanting fluorine into silicon for oxidation. Thus, the problem of thinning of the gate insulator film 13 on the gate end can be solved by employing fluorine ions as the implanted ions 40.

When the implanted ions 40 are prepared from fluorine, the implanted fluorine thermally diffuses in formation of the bird's beak to reach the interface between the silicon substrate 1 and the bird's beak, thereby accelerating oxidation. Therefore, the shape of the bird's beak formed on the upper end of the STI structure is further rounded, to further improve the effect of relaxing stress.

Further, such a phenomenon is known that an impurity diffusion layer formed as a channel doping layer in contact with the interface between the STI structure and the silicon substrate 1 segregates in heat treatment to reduce the concentration around the interface. Thus, it follows that the so-called inverse narrow effect reducing the threshold voltage as the gate width GW is reduced is observed. When nitrogen is present on the interface between the STI structure and the silicon substrate 1, this segregation is suppressed and hence the inverse narrow channel effect is relaxed. Therefore, dispersion of the threshold voltage caused by fluctuation of the gate width GW is suppressed, whereby the yield of the semiconductor device is further improved.

The superiority of the method of manufacturing a semiconductor device according to the embodiment 3 over the prior art disclosed in the aforementioned literature is now described in detail.

Literature 4 discloses a technique of directly implanting nitrogen ions into the inner wall of a trench in FIG. 2. In this method, however, defects are disadvantageously introduced into an STI structure/silicon substrate interface following the ion implantation. Particularly when the widths of the STI structure and an active region are narrowly set below 1 $\mu$m and nitrogen is implanted into a portion around the STI structure at a dose of at least $1 \times 10^{14}/cm^2$, dislocations are caused in a silicon substrate 1 not only in inner wall oxidation but also in thermal shrinking.

Literature 2 discloses a method of suppressing a bird's beak formed in the process of oxidation by implanting nitrogen into a silicon substrate through a silicon dioxide film located on the upper end of an STI structure in FIG. 3.

In the embodiment 3 of the present invention, on the other hand, nitrogen or fluorine is implanted into the polysilicon film 3 and the silicon dioxide film 2 located under the silicon nitride film 4 serving as a hard mask for forming the bird's beak. In other words, the method according to the embodiment 3 is different from the well-known method in the point that the implanted ion species such as nitrogen is not directly introduced into the inner wall insulator film 8 formed on the side wall of the trench 7 or the interface between the silicon dioxide film 2 formed on the main surface of the silicon substrate 1 and the silicon substrate 1 but introduced by thermal diffusion. While defects are newly caused when the implanted ion species is directly introduced into the interface by ion implantation, the ion species is introduced through thermal diffusion in the embodiment 3 and hence it is possible to avoid formation of new defects following introduction of the ion species. In other words, the method according to the embodiment 3 can attain such an advantage that the defect density can be reduced.

10. Embodiment 4

A method of manufacturing a semiconductor device according to an embodiment 4 of the present invention is characterized in that nitrogen, halogen or nitrogen halide is ion-implanted into a filled insulation forming a principal part of an STI structure formed on a semiconductor substrate. The element such as nitrogen introduced into the filled insulation also thermally diffuses in heat treatment (e.g., inner wall oxidation) similarly to the embodiment 3, to reach a portion around a bird's beak on the upper end of the STI structure or the interface between a silicon dioxide film 2 and a silicon substrate 1. Consequently, the interface state density is reduced in this region.

Ion implantation of nitrogen or the like characterizing the embodiment 4 can be performed in combination with the embodiment 1 or 2 (including any modification) or in the conventional manufacturing method. The ion implantation of nitrogen or the like can be performed in various steps, as illustrated in FIGS. 46 and 47.

Figure 46:
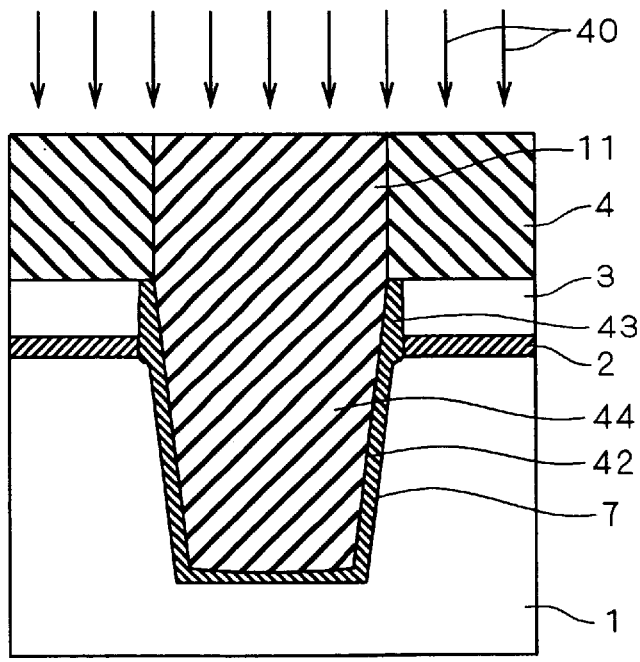
FIGS. 46 and 47 illustrate steps of manufacturing a semiconductor device according to an embodiment 4 of the present invention.

In the example shown in FIG. 46, ions 40 of nitrogen or the like are implanted after a trench 7 is filled with silicon dioxide forming a filled insulation 44 and the upper surface of the silicon dioxide film 44 is flattened through a silicon nitride film 4 serving as a stopper. At this time, the ions 40 are implanted into the filled insulation 44, the silicon nitride film 4, a polysilicon film 3, a bird's beak 43 and the like. The implanted element such as nitrogen thermally diffuses in subsequent heat treatment (e.g., a thermal shrinking step or heat treatment necessary for forming a MOSFET) to reach the interface between an STI structure and the silicon substrate 1 of between the silicon dioxide film 2 and the silicon substrate 1, to reduce the interface state density.

Figure 47:
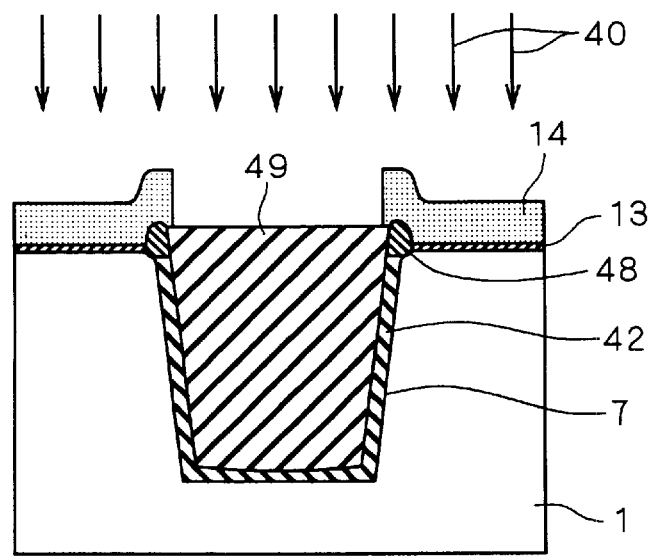
Figure 48:
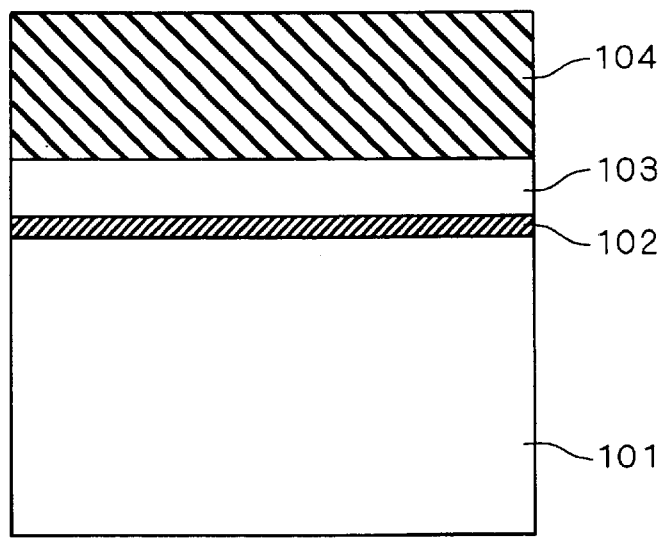
FIGS. 48 to 58 illustrate steps of manufacturing a conventional semiconductor device.
Figure 49:
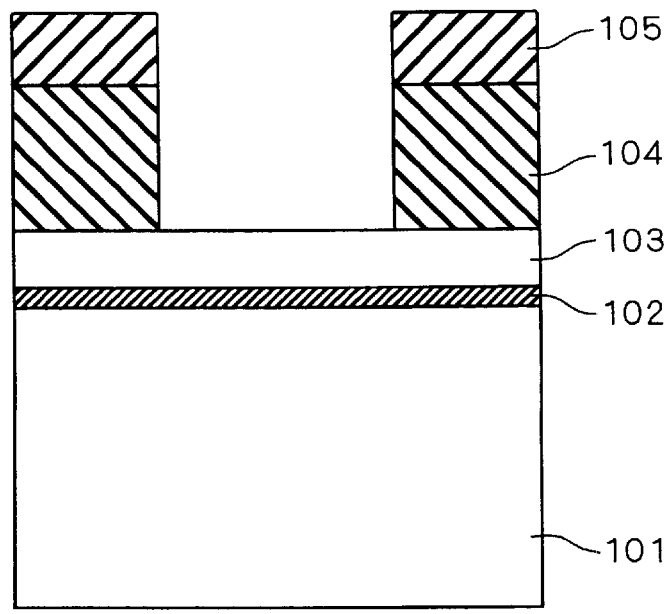
Figure 50:
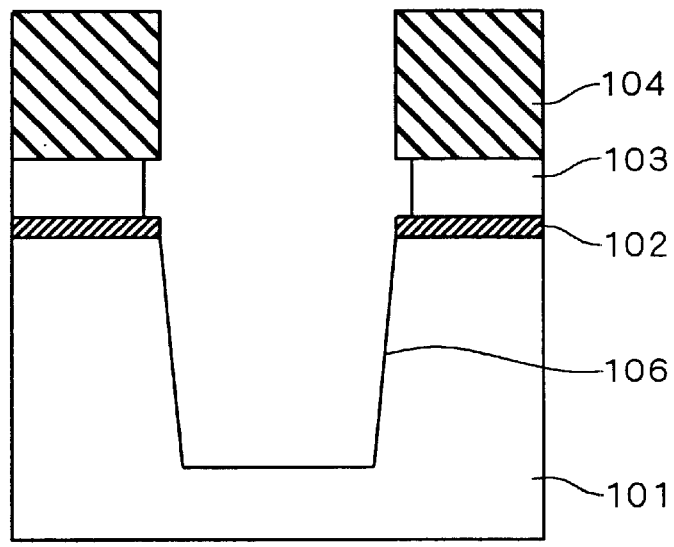
Figure 51:
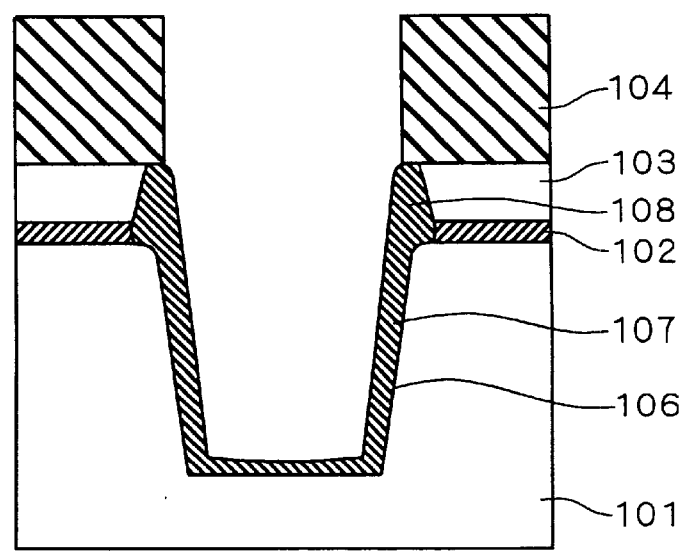
Figure 52:
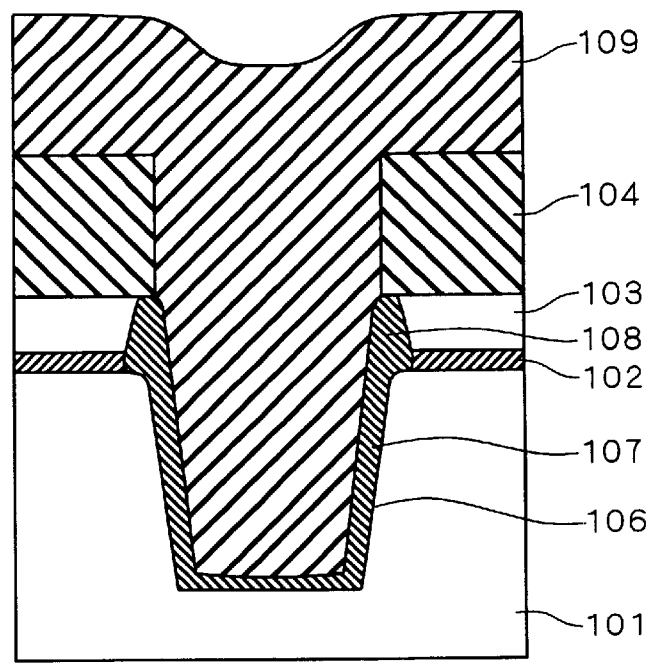
Figure 53:
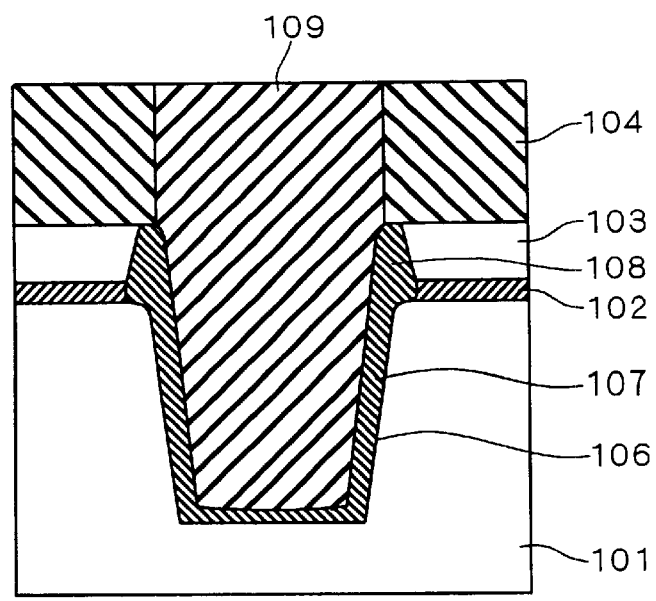
Figure 54:
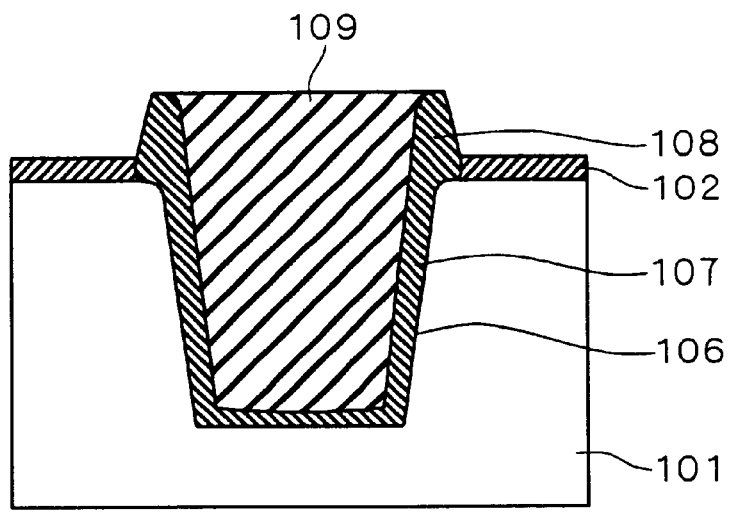
Figure 55:
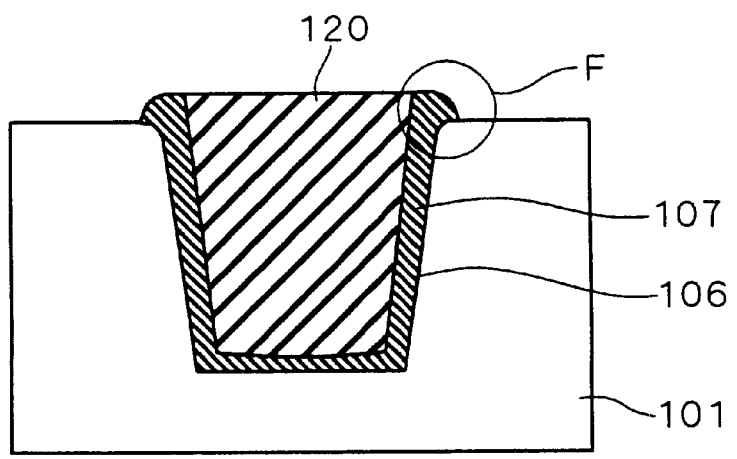

In the example shown in FIG. 47, ions 40 of nitrogen or the like are implanted after a gate insulator film 13 and a gate electrode 14 are formed. At this time, the ions 40 are implanted into a filled insulation 49, a bird's beak 48, the gate electrode 14 and the like. FIGS. 46 and 47 show mere illustrations, and the ions 40 can be implanted in various steps so far as the ions 40 can be implanted into the filled insulation 44 or 49 and subsequent heat treatment is planned, to attain similar effects. For example, the ions 40 can be implanted after removing a three-layer film consisting of a silicon dioxide film 2, a polysilicon film 3 and a silicon nitride film 4 serving as a hard mask.

Needless to say in detail, the discussion related to the superiority over the known literature also applies to the embodiment 4 similarly to the embodiment 3.

11. Modifications of Embodiments 1 to 4

While each of the embodiments 1 to 4 has been described with reference to a semiconductor substrate formed by a silicon substrate, it goes without saying that the present invention is not restricted to a silicon substrate but is also applicable to a substrate mainly composed of a material other than silicon, and is further applicable not only to a bulk substrate but also to an SOI (silicon on insulator) substrate. Further, the present invention is applicable to wide-ranging semiconductor devices including a DRAM (dynamic random access memory), an SRAM (static random access memory), an EEPROM (electrically erasable programmable read only memory), a logic circuit and a semiconductor device prepared by combining the same.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having an element isolation structure, which separates a main surface of a semiconductor substrate into a plurality of regions, selectively formed on said main surface, and a semiconductor element formed on each of said plurality of regions, wherein
    said element isolation structure comprises:
        an oxide semiconductor film formed in contact with an inner wall of a trench selectively formed in said main surface;
        a bird's beak formed of an insulating film being located only at an opening edge of said trench, growing in thickness toward said opening, and containing nitrogen; and an insulator filling in said trench through said oxide semiconductor film.

2. The semiconductor device according to claim 1, wherein said insulator filling in said trench contains fluorine.

3. A semiconductor device having an element isolation structure, which separates a main surface of a semiconductor substrate into a plurality of regions, selectively formed on said main surface, and a semiconductor element formed on each of said plurality of regions, wherein said element isolation structure comprises:
an oxide semiconductor film formed in contact with an inner wall of a trench selectively formed in said main surface;
a nitride semiconductor film formed on said inner wall to cover said oxide semiconductor film and including a bird's beak that is a thick portion at an opening edge of said trench; and
a fluorine-containing insulator filling in said trench through said nitride semiconductor film.

4. The semiconductor device according to claim 3, wherein said nitride semiconductor film contains fluorine.

* * * * *

UNITED STATES PATENT AND TRADEMARK OFFICE
CERTIFICATE OF CORRECTION

PATENT NO. : 6,495,424 B2
DATED : December 17, 2002
INVENTOR(S) : Kunikiyo

It is certified that error appears in the above-identified patent and that said Letters Patent is hereby corrected as shown below:

<u>Title page,</u>
Item [63], Related U.S. Application Data, should read:
-- Related U.S. Application Data

[63]  Continuation of application No. 09/549,378, filed on Apr. 13, 2000, now Pat. No. 6,333,232. --

Signed and Sealed this

Twenty-ninth Day of April, 2003

JAMES E. ROGAN
*Director of the United States Patent and Trademark Office*